(12) United States Patent
Patra

(10) Patent No.: US 12,516,963 B2
(45) Date of Patent: Jan. 6, 2026

(54) METHOD FOR DETERMINING A POSITION OF A MIRROR

(71) Applicant: Carl Zeiss SMT GmbH, Oberkochen (DE)

(72) Inventor: Michael Patra, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 115 days.

(21) Appl. No.: 18/609,453

(22) Filed: Mar. 19, 2024

(65) Prior Publication Data

US 2024/0255319 A1    Aug. 1, 2024

Related U.S. Application Data

(63) Continuation of application No. PCT/EP2022/075609, filed on Sep. 15, 2022.

(30) Foreign Application Priority Data

Sep. 23, 2021   (DE) .................... 10 2021 210 577.7

(51) Int. Cl.
*G01D 5/28*   (2006.01)
*G01D 5/26*   (2006.01)
(Continued)

(52) U.S. Cl.
CPC ............. *G01D 5/285* (2013.01); *G01D 5/266* (2013.01); *G02B 26/001* (2013.01);
(Continued)

(58) Field of Classification Search
CPC ............ G01B 9/02027; G01B 9/02039; G01B 9/02084; G02B 26/001; G01D 5/266; G01D 5/285; G03F 7/70141; G03F 7/7015; G03F 7/702; G03F 7/70233; G03F 7/70258; G03F 7/70316; G03F 7/70325; G03F 7/70408;
(Continued)

(56) References Cited

U.S. PATENT DOCUMENTS 6,573,978 B1    6/2003   McGuire, Jr.
10,101,667 B2   10/2018  Freimann et al.
(Continued)

FOREIGN PATENT DOCUMENTS

DE    10 2008 009 600 A1    8/2009
DE    10 2008 030 664 A1    1/2010
(Continued)

OTHER PUBLICATIONS

Translation of International Search Report for corresponding PCT Appl No. PCT/EP2022/075609, dated Jan. 19, 2023.
(Continued)

*Primary Examiner* — Peter B Kim
(74) *Attorney, Agent, or Firm* — Fish & Richardson P.C.

(57) ABSTRACT

A method for determining a position of a mirror of an optical system comprises: a) providing at least one parameter from a mechanical model of the mirror; b) interferometrically detecting a temporal change in a distance of a point of a curved mirror effective surface; and c) ascertaining an amplitude and a phase of N eigenmodes from the temporal change in the distance and the at least one parameter to determine the position of the mirror.

20 Claims, 37 Drawing Sheets

(51) Int. Cl.
  *G02B 26/00* (2006.01)
  *G03F 7/00* (2006.01)
(52) U.S. Cl.
  CPC ........ *G03F 7/70141* (2013.01); *G03F 7/7015* (2013.01); *G03F 7/702* (2013.01); *G03F 7/70233* (2013.01); *G03F 7/70258* (2013.01); *G03F 7/70316* (2013.01); *G03F 7/70325* (2013.01); *G03F 7/70408* (2013.01); *G03F 7/70508* (2013.01); *G03F 7/70516* (2013.01); *G03F 7/70525* (2013.01)
(58) Field of Classification Search
  CPC ............. G03F 7/70508; G03F 7/70516; G03F 7/70525; G03F 7/7085
  See application file for complete search history.

(56) References Cited

U.S. PATENT DOCUMENTS

| | | |
|---|---|---|
| 2004/0227915 A1 | 11/2004 | Ohtsuka |
| 2006/0132747 A1 | 6/2006 | Singer et al. |
| 2011/0164232 A1 | 7/2011 | Freimann et al. |
| 2017/0023865 A1 | 1/2017 | Freimann et al. |
| 2018/0074303 A1 | 3/2018 | Schwab |
| 2020/0272058 A1 | 8/2020 | Bieling et al. |

FOREIGN PATENT DOCUMENTS

| | | | |
|---|---|---|---|
| DE | 10 2017 220 586 A1 | 5/2019 | |
| DE | 10 2019 215 216 A1 | 11/2019 | |
| DE | 10 2019 219 209 A1 | 1/2020 | |
| DE | 10 2020 211 696 A1 | 4/2021 | |
| EP | 1 614 008 B1 | 10/2004 | |
| EP | 2634551 A1 * | 9/2013 | ............ G01J 3/4535 |

OTHER PUBLICATIONS

Houston, J.B. et al., "A Laser Unequal Path Interferometer for the Optical Shop," Applied Optics, vol. 6, No. 7, Jul. 1967.

* cited by examiner

METHOD FOR DETERMINING A POSITION OF A MIRROR

CROSS-REFERENCE TO RELATED APPLICATIONS

The present application is a continuation of, and claims benefit under 35 USC 120 to, international application No. PCT/EP2022/075609, filed Sep. 15, 2022, which claims benefit under 35 USC 119 of German Application No. 10 2021 210 577.7, filed Sep. 23, 2021. The entire disclosure of each these applications is incorporated by reference herein.

FIELD

The present disclosure relates to a method for determining a pose of a mirror in an optical system.

BACKGROUND

Microlithography is used for producing microstructured components, for example integrated circuits. The microlithography process is carried out using a lithography apparatus, which has an illumination system and a projection system. The image of a mask (reticle) illuminated via the illumination system is projected here via the projection system onto a substrate, for example a silicon wafer, which is coated with a light-sensitive layer (photoresist) and arranged in the image plane of the projection system, in order to transfer the mask structure to the light-sensitive coating of the substrate.

Driven by the desire for ever smaller structures in the production of integrated circuits, EUV lithography apparatuses that use light with a wavelength in the range from 0.1 nm to 30 nm, in particular 13.5 nm, are currently under development. In the case of such EUV lithography apparatuses, because of the high absorption of light of this wavelength by most materials, reflective optical units, that is to say mirrors, are typically used instead of—as previously—refractive optical units, that is to say lens elements.

In a projection system as explained above, it is desirable to be able to control the mirrors in six rigid body degrees of freedom. To this end, six interferometers per mirror can be used to measure the mirrors. These interferometers use special targets which are arranged on the mirror outside of its curved used mirror surface. In this case, the targets may be attached to the mirror on the back side. However, this assumes that a fixed reference, to which the interferometers can be attached, is arranged opposite the back side of the mirror. Such a fixed reference can be what is known as a sensor frame.

However, for replacing the mirrors for example, it may be desirable for an exterior but an interior fixed reference that to be provided. In the present case, "interior" means that the respective used mirror surface of the mirrors is arranged facing the fixed reference. In the latter case, it is hardly possible with the aid of the interferometers to measure the mirrors from the back since an exterior fixed reference for carrying the mirrors is no longer provided.

SUMMARY

The present disclosure seeks to provide an improved method for determining a pose of a mirror in an optical system for a projection exposure apparatus.

Accordingly, a method for determining a pose of a mirror in an optical system in proposed. The method includes the following steps: a) providing at least one parameter from a mechanical model of the mirror, b) interferometrically detecting a temporal change of a distance of a point on a curved used mirror surface of the mirror, and c) ascertaining an amplitude $A_k$ and a phase $\Phi_k$ of N eigenmodes, where $k=1, \ldots, N$, from the temporal change of the distance and the at least one parameter in order to determine the pose of the mirror.

For example, the mechanical model of the mirror can be a CAD (computer-aided design) model of the mirror. For example, the respective eigenfrequencies from the mechanical model can be provided as parameters for the N eigenmodes. The so-called mode profile is an example of a further parameter that can be gathered from the mechanical model of the mirror.

Interferometric detection can be implemented with the aid of a measuring arrangement, yet to be explained below, which comprises an interferometer and a beam shaping unit. The temporal change of the distance of the point on the curved used mirror surface should in particular be understood to the effect that the change is determined from a time $t_1$ to a time $t_2$ or from a time $t_1$ to a time $t_3$ that differs from the time $t_2$.

For example, the amplitude $A_k$ and the phase $\Phi_k$ of the eigenmodes can be ascertained with the aid of a bandpass filter or a Fourier transform. The pose of the mirror is then determined on the basis of the temporal change of the distance and on the basis of at least one parameter of the mechanical model. A plurality of different parameters can also be used.

The aforementioned distance can be defined as a distance between a fixed reference, for example a sensor frame in the present case, and the point on the mirror, for example on the used mirror surface. Accordingly, step b) may comprise an interferometric detection of a temporal change of a distance of a point on a curved used mirror surface of the mirror from a reference, in particular a fixed or immobile reference. However, the reference may also be movable.

According to an embodiment, the pose of the mirror is determined in step c) by virtue of the amplitude $A_k$ and the phase $\Phi_k$ of the N eigenmodes being calculated from the mechanical model.

For example, the calculation is implemented by virtue of combining by calculation the amplitude $A_k$ and the phase $\Phi_k$ with one or more parameters of the mechanical model. An evaluation device is provided to this end. The evaluation device can comprise a computer unit.

According to an embodiment, a temporal change of a distance of a multiplicity of points on the curved used mirror surface of the mirror is detected interferometrically in step b).

Optionally, at least six points are detected interferometrically. This allows a detection of all six degrees of freedom of the mirror.

According to an embodiment, the method includes the following step: d) controlling actuators, which are provided on the mirror, on the basis of the amplitude $A_k$ and the phase $\Phi_k$ of the N eigenmodes, in such a way that the amplitude $A_k$ is reduced.

The actuators can be controlled in such a way that the used mirror surface deforms, whereby the amplitude $A_k$ is reduced. Consequently, the deformation acts counter to the amplitude $A_k$. For example, instructions for controlling the actuators are generated by a control device of the optical system in step d), from at least one amplitude $A_k$ and phase $\Phi_k$ determined in step c). For example, the nature of these instructions is such that the amplitude $A_k$ is reduced thereby, i.e. the vibration is damped. The actuators are provided on the back side on the mirror for example. In the present case, actuators being "provided" on the mirror means that, for example, the actuators are connected, in particular operatively connected, or coupled to the mirror. For example, the actuators may be adhesively bonded to the mirror on the back side. In the case where the method includes step d), the method can also be referred to as a method for damping mirror vibrations of a mirror in an optical system.

According to an embodiment, the method is performed with the aid of a measuring arrangement, the measuring arrangement comprising an interferometer and a beam shaping unit.

According to an embodiment, a measurement beam of the interferometer is shaped with the aid of the beam shaping unit such that light rays of the measurement beam are oriented at right angles to the used mirror surface at each point in a region in which the measurement beam is incident on the used mirror surface. Alternatively, the measurement beam is shaped such that the measurement beam is focused on the point.

According to an embodiment, the measuring arrangement comprises a reflector mirror, with the aid of which the measurement beam reflected by the used mirror surface is reflected back to the used mirror surface.

From the used mirror surface, the measurement beam is reflected back to the interferometer. As a result of perpendicular incidence of the focused measurement beam on the used mirror surface no longer being used, it is possible to position the interferometer and reflector mirror largely without constraints. The reflector mirror can be plane or curved. There may be a deterioration in the measurement quality should the reflector mirror be plane. The measurement result can be improved by virtue of the reflector mirror being equipped with refractive power and being curved. For example, the reflector mirror has a spherical geometry.

According to an embodiment, the reflector mirror is arranged between the interferometer and the beam shaping unit.

This applies especially to the case where the reflector mirror is plane. This can help ensure that the measurement beam propagates back to the interferometer again. However, it is also possible to entirely dispense with the additional reflector mirror. However, this case involves the measurement beam to be incident perpendicularly on the used mirror surface.

According to an embodiment, the optical system further comprises a fixed reference, for example a sensor frame, used to carry the measuring arrangement, wherein the used mirror surface is arranged facing the fixed reference.

For example, this means that a back side of the mirror is placed facing away from the fixed reference. The measuring arrangement or arrangements may be securely connected to the fixed reference.

According to an embodiment, the optical system further comprises a multiplicity of mirrors, the mirrors being arranged such that the fixed reference is arranged interiorly in relation to the mirrors.

In the present case, "interior" means that, in particular, the used mirror surfaces of the mirrors are oriented to face the fixed reference. In contrast thereto, "exterior" means that the used mirror surfaces are arranged facing away from the fixed reference. For example, some mirrors may also be arranged in such a way that the fixed reference is arranged interiorly in relation thereto, while other mirrors may be arranged such that the fixed reference is arranged exteriorly in relation thereto.

An optical system for a projection exposure apparatus is also proposed. The optical system comprises a mirror with a curved used mirror surface and a measuring arrangement for determining a pose of the mirror, wherein the measuring arrangement comprises an interferometer and a beam shaping unit configured to shape a measurement beam of the interferometer in such a way that light rays of the measurement beam are oriented at right angles to the used mirror surface at each point in a region in which the measurement beam is incident on the used mirror surface.

As a result of the beam shaping unit being provided, it is possible to measure the mirror on its curved used mirror surface. Firstly, this makes it possible to dispense with targets attached to the mirror, and, secondly, this renders a back-side measurement of the mirror dispensable. Consequently, the used mirror surface can be oriented to face a fixed reference of the optical system.

The optical system is an illumination optical unit of the projection exposure apparatus or can be referred to as such. The mirror is suitable for reflecting EUV radiation. The used mirror surface has reflective properties and is suitable for reflecting EUV radiation. In some embodiments, the mirror does not have reflective properties away from the used mirror surface. For example, the used mirror surface can be curved spherically, i.e. in ball-shaped fashion. However, the used mirror surface can be locally ellipsoidal. This means that the used mirror surface has different radii of curvature in different directions. The optical system may comprise a plurality of measuring arrangements and any desired number of mirrors. The mirrors can also be referred to as EUV mirrors. For example, the optical system comprises five, six, seven, eight, nine, ten, eleven or more than eleven mirrors.

Optionally, a coordinate system with a first spatial direction or x-direction, a second spatial direction or y-direction and a third spatial direction or z-direction is assigned to the optical system. The directions are oriented perpendicularly to one another. Each mirror has six degrees of freedom or six rigid body degrees of freedom, namely three translational degrees of freedom in the x-direction, the y-direction and the z-direction, respectively, and three rotational degrees of freedom about the x-direction, the y-direction and the z-direction, respectively.

The "position" of the respective mirror should be understood to mean its coordinates or the coordinates of a measurement point attached to the respective mirror, with respect to the x-direction, the y-direction and the z-direction. In particular, the "orientation" of the respective mirror should be understood to mean its tilt in relation to the x-direction, the y-direction and the z-direction. In the present case, the "pose" should be understood to be both the position and the orientation of the respective mirror. In the present case, "adjusting" or "aligning" should be understood to mean that the respective mirror is brought from an actual pose to a target pose. Accordingly, the measuring arrangement can control actuator systems which make it possible to bring the respective mirror from its actual pose to its target pose. This renders pose control possible. The pose, in particular the target pose, of the respective mirror can be subject to open-loop or closed-loop control.

The "pose" can also be understood to mean the pose of any desired point on the used mirror surface, which may change as a result of a vibration-related local deformation of the mirror or used mirror surface. Consequently, detecting a multiplicity of points on the used mirror surface renders possible a vibration measurement or oscillation measurement on the used mirror surface or mirror.

In the present case, "open-loop control" or "closed-loop control" should be understood to mean, in particular, the practice of actively ensuring that actual poses and target poses do not deviate from one another, or only deviate insubstantially from one another. Open-loop control of the "pose" of a mirror should be understood to mean not only the open-loop control of the aforementioned six rigid body degrees of freedom of the mirror but also the suppression of mirror vibrations as this is the only way that the actual poses of any desired points on the used mirror surface correspond to their target poses.

These mirror vibrations can be counteracted with the aid of actuator systems or actuators which enable a local elastic deformation of the used mirror surface with the target of vibration damping. These last-mentioned actuators, for example in the form of piezo actuators, may be attached to the back side of the mirror. The actuators are configured to apply forces and/or bending moments to the mirror and consequently elastically deform the latter. These actuators may also be arranged between the used mirror surface and a mirror substrate of the mirror.

The interferometer is suitable for emitting the measurement beam. The measurement beam can be a laser beam. For example, the measurement beam can be described by its wavefront. The measurement beam propagates from the interferometer to the used mirror surface and back to the interferometer. The interferometer measures the distance from the used mirror surface in units of wavelength, i.e. in units of the spacing between the wavefronts. As a result of the light rays of the measurement beam being oriented at right angles to the used mirror surface at each point in the region in which the measurement beam is incident on the used mirror surface, it is possible to measure the used mirror surface directly without different measured distances arising over the width of the used front.

For example, the beam shaping unit can help ensure that the wavefronts are oriented locally parallel to that used mirror surface upon incidence on the used mirror surface. For example, the beam shaping unit is arranged between the interferometer and the used mirror surface. The optical system may comprise a plurality of measuring arrangements.

According to an embodiment, the beam shaping unit is a refractive, a reflective or a diffractive optical element.

If the beam shaping unit is designed as a refractive optical element, then it is a lens element. If the beam shaping unit is designed as a reflective optical element, then it is a mirror. If the beam shaping unit is designed as a diffractive optical element, then it is a grating for example.

According to an embodiment, the beam shaping unit has different refractive powers in different spatial directions should the beam shaping unit be a refractive optical element.

For example, the beam shaping unit has different radii of curvature in different directions. Hence, a surface of the beam shaping unit has a different refractive power in each different direction.

A further optical system for a projection exposure apparatus is also proposed. The optical system comprises a mirror with a curved used mirror surface and a measuring arrangement for determining a pose of the mirror, wherein the measuring arrangement comprises an interferometer and a beam shaping unit configured to shape a measurement beam of the interferometer in such a way that the measurement beam is focused on a point of the used mirror surface.

For example, the latter optical system differs from the former optical system only in that a different embodiment of the beam shaping unit is provided. If the measurement beam is focused on the point of the used mirror surface, it is not mandatory for the measurement beam to be incident on the used mirror surface at right angles. This renders a multiplicity of degrees of freedom possible when placing the measuring arrangement.

According to an embodiment, the beam shaping unit is a refractive, a reflective or a diffractive optical element.

The beam shaping unit can be a lens element, a mirror or an optical grating.

According to an embodiment, the measuring arrangement comprises a reflector mirror configured to reflect the measurement beam reflected by the used mirror surface back to the used mirror surface.

From the used mirror surface, the measurement beam is reflected back to the interferometer. As a result of perpendicular incidence of the focused measurement beam on the used mirror surface no longer being used, it is possible to position the interferometer and reflector mirror largely without constraints. The reflector mirror can be plane or curved. There may be a deterioration in the measurement quality should the reflector mirror be plane. The measurement result can be improved by virtue of the reflector mirror being equipped with refractive power and being curved. For example, the reflector mirror has a spherical geometry.

According to an embodiment, the reflector mirror is arranged between the interferometer and the beam shaping unit.

This applies especially to the case where the reflector mirror is plane. This ensures that the measurement beam propagates back to the interferometer again. However, it is also possible to entirely dispense with the additional reflector mirror. However, this case involves the measurement beam to be incident perpendicularly on the used mirror surface.

According to an embodiment, the measuring arrangement is arranged such that the measurement beam is incident perpendicularly on the used mirror surface and thus propagates back on itself following a reflection at the used mirror surface.

That is to say it is possible to dispense with the additional reflector mirror. This can help allow for a particularly simple structure of the measuring arrangement.

According to an embodiment, the optical system further comprises a fixed reference, such as a sensor frame, which carries the measuring arrangement, wherein the used mirror surface is arranged facing the fixed reference.

For example, this means that the back side of the mirror is placed facing away from the fixed reference. The measuring arrangement or arrangements may be securely connected to the fixed reference.

According to an embodiment, the optical system further comprises a multiplicity of mirrors, the mirrors being arranged such that the fixed reference is arranged interiorly in relation to the mirrors.

In the present case, "interior" means that, in particular, the used mirror surfaces of the mirrors are oriented to face the fixed reference. In contrast thereto, "exterior" means that the used mirror surfaces are arranged facing away from the fixed reference. For example, some mirrors may also be arranged in such a way that the fixed reference is arranged interiorly in relation thereto, while other mirrors may be arranged such that the fixed reference is arranged exteriorly in relation thereto.

Furthermore, a projection exposure apparatus comprising such an optical system is proposed.

As previously mentioned, the optical system can be a projection optical unit of the projection exposure apparatus.

However, the optical system may also be an illumination system. The projection exposure apparatus can be an EUV lithography apparatus. EUV stands for "extreme ultraviolet" and refers to a wavelength of the working light of between 0.1 nm and 30 nm. The projection exposure apparatus can also be a DUV lithography apparatus. DUV stands for "deep ultraviolet" and refers to a wavelength of the working light of between 30 nm and 250 nm.

"A" or "an" or "one" in the present case should not necessarily be understood to be restrictive to exactly one element. Rather, a plurality of elements, such as two, three or more, can also be provided. Nor should any other numeral used here be understood to the effect that there is a restriction to exactly the stated number of elements. Instead, unless indicated otherwise, numerical deviations upward and downward are possible.

The embodiments and features described for the optical system apply correspondingly to the proposed projection exposure apparatus and to the proposed method, and vice versa.

Further possible implementations of the disclosure also include combinations which were not mentioned explicitly of features or embodiments described above or hereinafter with respect to the exemplary embodiments. In this case, a person skilled in the art will also add individual aspects as improvements or supplementations to the respective basic form of the disclosure.

Further configurations and aspects of the disclosure are the subject of the dependent claims and also of the exemplary embodiments of the disclosure that are described hereinafter. The disclosure is explained in greater detail hereinafter on the basis of embodiments with reference to the accompanying figures.

DETAILED DESCRIPTION

Unless indicated otherwise, elements that are identical or functionally identical have been provided with the same reference signs in the figures. It should also be noted that the illustrations in the figures are not necessarily true to scale.

Figure 1:
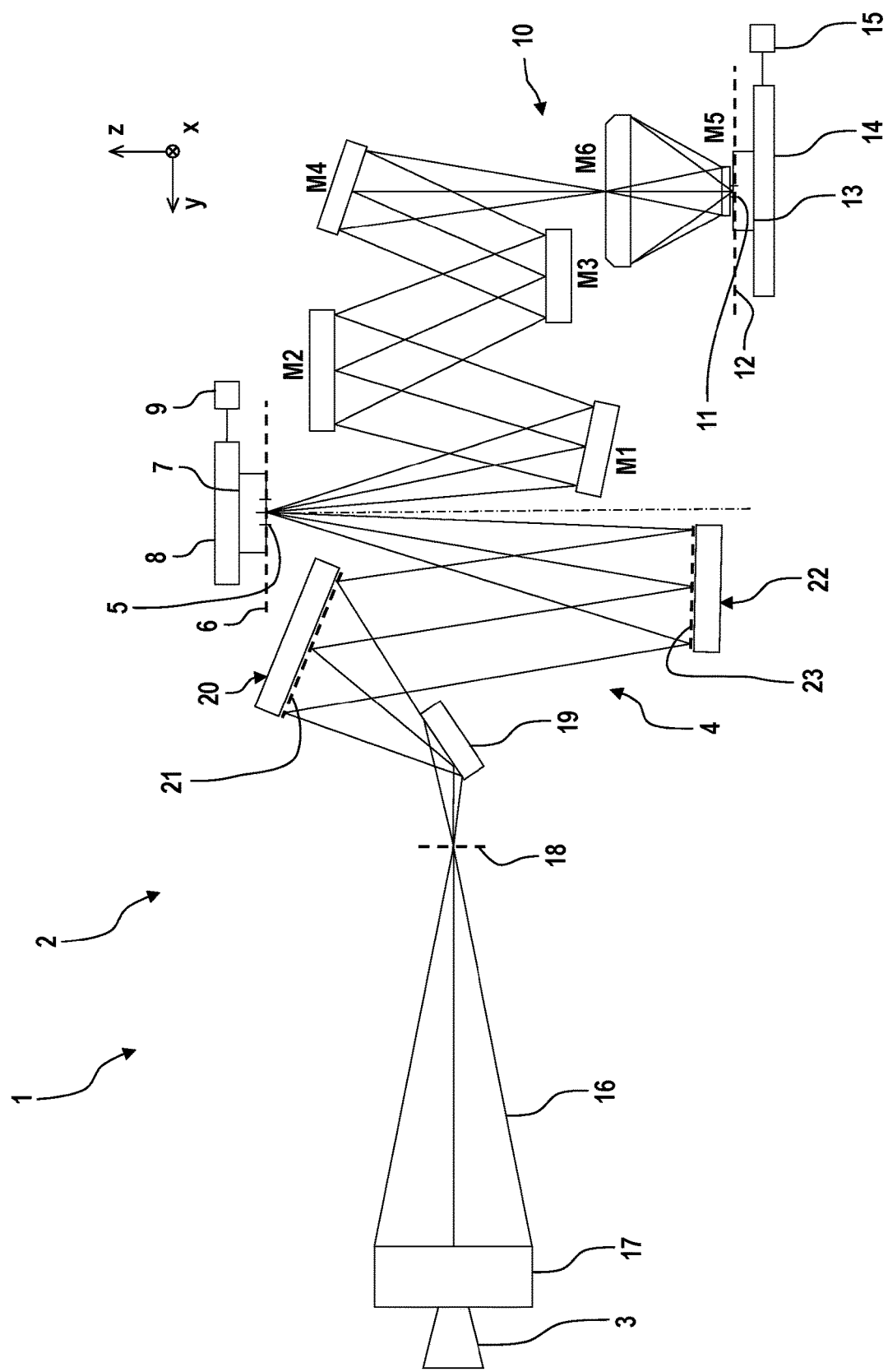
FIG. 1 shows a schematic meridional section of a projection exposure apparatus for EUV projection lithography.

FIG. 1 shows an embodiment of a projection exposure apparatus 1 (lithography apparatus), in particular an EUV lithography apparatus. One embodiment of an illumination system 2 of the projection exposure apparatus 1 has, in addition to a light or radiation source 3, an illumination optical unit 4 for illuminating an object field 5 in an object plane 6. In an alternative embodiment, the light source 3 may also be provided as a module separate from the rest of the illumination system 2. In this case, the illumination system 2 does not comprise the light source 3.

A reticle 7 arranged in the object field 5 is exposed. The reticle 7 is held by a reticle holder 8. The reticle holder 8 is displaceable by way of a reticle displacement drive 9, in particular in a scanning direction.

FIG. 1 shows, for explanatory purposes, a Cartesian coordinate system with an x-direction x, a y-direction y and a z-direction z. The x-direction x runs perpendicularly into the plane of the drawing. The y-direction y runs horizontally, and the z-direction z runs vertically. The scanning direction in FIG. 1 runs in the y-direction y. The z-direction z runs perpendicularly to the object plane 6.

The projection exposure apparatus 1 comprises a projection optical unit 10. The projection optical unit 10 serves for imaging the object field 5 into an image field 11 in an image plane 12. The image plane 12 extends parallel to the object plane 6. Alternatively, an angle that differs from 0° between the object plane 6 and the image plane 12 is also possible.

A structure on the reticle 7 is imaged onto a light-sensitive layer of a wafer 13 arranged in the region of the image field 11 in the image plane 12. The wafer 13 is held by a wafer holder 14. The wafer holder 14 is displaceable by way of a wafer displacement drive 15, in particular in the y-direction y. The displacement firstly of the reticle 7 by way of the reticle displacement drive 9 and secondly of the wafer 13 by way of the wafer displacement drive 15 can be implemented so as to be mutually synchronized.

The light source 3 is an EUV radiation source. The light source 3 emits in particular EUV radiation 16, which is also referred to below as used radiation, illumination radiation or illumination light. In particular, the used radiation 16 has a wavelength in the range between 5 nm and 30 nm. The radiation source 3 can be a plasma source, for example an LPP (laser produced plasma) source or a GDPP (gas discharge produced plasma) source. It may also be a synchrotron-based radiation source. The light source 3 can be a free electron laser (FEL).

The illumination radiation 16 emanating from the light source 3 is focused by a collector 17. The collector 17 can be a collector with one or more ellipsoidal and/or hyperboloidal reflection surfaces. The illumination radiation 16 can be incident on the at least one reflection surface of the collector 17 with grazing incidence (GI), that is to say at angles of incidence of greater than 45°, or with normal incidence (NI), that is to say at angles of incidence of less than 45°. The collector 17 may be structured and/or coated, firstly to optimize its reflectivity for the used radiation and secondly to suppress extraneous light.

Downstream of the collector 17, the illumination radiation 16 propagates through an intermediate focus in an intermediate focal plane 18. The intermediate focal plane 18 may represent a separation between a radiation source module, having the light source 3 and the collector 17, and the illumination optical unit 4.

The illumination optical unit 4 comprises a deflection mirror 19 and, arranged downstream thereof in the beam path, a first facet mirror 20. The deflection mirror 19 can be a plane deflection mirror or, alternatively, a mirror with a beam-influencing effect that goes beyond the purely deflecting effect. As an alternative or in addition, the deflection mirror 19 may be in the form of a spectral filter that separates a used light wavelength of the illumination radiation 16 from extraneous light at a wavelength deviating therefrom. The illumination of the first facet mirror 20 using illumination radiation 16 or an arising intensity profile is also referred to as far field. If the first facet mirror 20 is arranged in a plane of the illumination optical unit 4 which is optically conjugate to the object plane 6 as field plane, then this facet mirror is also referred to as a field facet mirror. The first facet mirror 20 comprises a multiplicity of individual first facets 21, which may also be referred to as field facets. Only some of these first facets 21 are shown in FIG. 1 by way of example.

The first facets 21 may be embodied as macroscopic facets, in particular as rectangular facets or as facets with an arcuate or part-circular edge contour. The first facets 21 may be in the form of plane facets or alternatively of facets with convex or concave curvature.

As is known for example from DE 10 2008 009 600 A1, the first facets 21 themselves may also each be composed of a multiplicity of individual mirrors, in particular a multiplicity of micromirrors. The first facet mirror 20 may in particular be in the form of a microelectromechanical system (MEMS system). For details, reference is made to DE 10 2008 009 600 A1.

Between the collector 17 and the deflection mirror 19, the illumination radiation 16 propagates horizontally, i.e. in the y-direction y.

In the beam path of the illumination optical unit 4, a second facet mirror 22 is arranged downstream of the first facet mirror 20. If the second facet mirror 22 is arranged in a pupil plane of the illumination optical unit 4, it is also referred to as a pupil facet mirror. The second facet mirror 22 can also be arranged at a distance from a pupil plane of the illumination optical unit 4. In this case, the combination of the first facet mirror 20 and the second facet mirror 22 is also referred to as a specular reflector. Specular reflectors are known from US 2006/0132747 A1, EP 1 614 008 B1, and U.S. Pat. No. 6,573,978.

The second facet mirror 22 comprises a plurality of second facets 23. In the case of a pupil facet mirror, the second facets 23 are also referred to as pupil facets.

The second facets 23 may likewise be macroscopic facets, which may for example have a round, rectangular or hexagonal boundary, or may alternatively be facets composed of micromirrors. In this regard, reference is likewise made to DE 10 2008 009 600 A1.

The second facets 23 can have plane or, alternatively, convexly or concavely curved reflection surfaces.

The illumination optical unit 4 thus forms a double-faceted system. This fundamental principle is also referred to as a fly's eye condenser (fly's eye integrator).

It may be desirable to arrange the second facet mirror 22 not exactly within a plane that is optically conjugate to a pupil plane of the projection optical unit 10. In particular, the second facet mirror 22 may be arranged so as to be tilted in relation to a pupil plane of the projection optical unit 10, as is described for example in DE 10 2017 220 586 A1.

With the aid of the second facet mirror 22, the individual first facets 21 are imaged into the object field 5. The second facet mirror 22 is the last beam-shaping mirror or indeed the last mirror for the illumination radiation 16 in the beam path upstream of the object field 5.

In an embodiment (not illustrated) of the illumination optical unit 4, a transfer optical unit may be arranged in the beam path between the second facet mirror 22 and the object field 5, and contributes in particular to the imaging of the first facets 21 into the object field 5. The transfer optical unit may have exactly one mirror or, alternatively, two or more mirrors, which are arranged in succession in the beam path of the illumination optical unit 4. The transmission optical unit can in particular comprise one or two normal-incidence mirrors (NI mirrors) and/or one or two grazing-incidence mirrors (GI mirrors).

In the embodiment shown in FIG. 1, the illumination optical unit 4 has exactly three mirrors downstream of the collector 17, specifically the deflection mirror 19, the first facet mirror 20, and the second facet mirror 22.

In an embodiment of the illumination optical unit 4, there is also no need for the deflection mirror 19, and so the illumination optical unit 4 may then have exactly two mirrors downstream of the collector 17, specifically the first facet mirror 20 and the second facet mirror 22.

The imaging of the first facets 21 into the object plane 6 via the second facets 23 or using the second facets 23 and a transfer optical unit is often only approximate imaging.

The projection optical unit 10 comprises a plurality of mirrors Mi, which are consecutively numbered in accordance with their arrangement in the beam path of the projection exposure apparatus 1.

In the example shown in FIG. 1, the projection optical unit 10 comprises six mirrors M1 to M6. Alternatives with four, eight, ten, twelve or any other number of mirrors Mi are likewise possible. The projection optical unit 10 is a doubly obscured optical unit. The penultimate mirror M5 and the last mirror M6 each have a through opening for the illumination radiation 16. The projection optical unit 10 has an image-side numerical aperture that is greater than 0.5 and may also be greater than 0.6 and may be for example 0.7 or 0.75.

Reflection surfaces of the mirrors Mi may be designed as freeform surfaces without an axis of rotational symmetry. Alternatively, the reflection surfaces of the mirrors Mi may be designed as aspherical surfaces with exactly one axis of rotational symmetry of the reflection surface shape. Just like the mirrors of the illumination optical unit 4, the mirrors Mi may have highly reflective coatings for the illumination radiation 16. These coatings may be designed as multilayer coatings, in particular with alternating layers of molybdenum and silicon.

The projection optical unit 10 has a large object-image offset in the y-direction y between a y-coordinate of a center of the object field 5 and a y-coordinate of the center of the image field 11. This object-image offset in the y-direction y may be of approximately the same magnitude as a z-distance between the object plane 6 and the image plane 12.

The projection optical unit 10 may in particular have an anamorphic form. It has in particular different imaging scales βx, βy in the x- and y-directions x, y. The two imaging scales βx, βy of the projection optical unit 10 can be (βx, βy)=(+/−0.25, +/−0.125). A positive imaging scale β means imaging without image inversion. A negative sign for the imaging scale β means imaging with image inversion.

The projection optical unit 10 consequently leads to a reduction in size with a ratio of 4:1 in the x-direction x, which is to say in a direction perpendicular to the scanning direction.

The projection optical unit 10 leads to a reduction in size of 8:1 in the y-direction y, which is to say in the scanning direction.

Other imaging scales are likewise possible. Imaging scales with the same sign and the same absolute value in the x-direction x and y-direction y are also possible, for example with absolute values of 0.125 or of 0.25.

The number of intermediate image planes in the x-direction x and in the y-direction y in the beam path between the object field 5 and the image field 11 may be the same or may differ, depending on the embodiment of the projection optical unit 10. Examples of projection optical units with different numbers of such intermediate images in the x- and y-directions x, y are known from US 2018/0074303 A1.

In each case one of the second facets 23 is assigned to exactly one of the first facets 21 for respectively forming an illumination channel for illuminating the object field 5. This may in particular result in illumination according to the Köhler principle. The far field is decomposed into a multiplicity of object fields 5 with the aid of the first facets 21. The first facets 21 produce a plurality of images of the intermediate focus on the second facets 23 respectively assigned to them.

By way of an assigned second facet 23, the first facets 21 are in each case imaged onto the reticle 7 in a manner overlaid on one another for the purposes of illuminating the object field 5. The illumination of the object field 5 is in particular as homogeneous as possible. It can have a uniformity error of less than 2%. Field uniformity can be achieved by superposing different illumination channels.

The illumination of the entrance pupil of the projection optical unit 10 may be defined geometrically by an arrangement of the second facets 23. The intensity distribution in the entrance pupil of the projection optical unit 10 may be set by selecting the illumination channels, in particular the subset of the second facets 23, which guide light. This intensity distribution is also referred to as illumination setting or illumination pupil filling.

A likewise preferred pupil uniformity in the region of portions of an illumination pupil of the illumination optical unit 4 which are illuminated in a defined manner may be achieved by a redistribution of the illumination channels.

Further aspects and details of the illumination of the object field 5 and in particular of the entrance pupil of the projection optical unit 10 are described hereinafter.

The projection optical unit 10 may in particular have a homocentric entrance pupil. The latter may be accessible. In this case, the entrance pupil is geometrically within the illumination optical unit 4. It may also be inaccessible. In this case, the entrance pupil is geometrically outside of the illumination optical unit 4.

The entrance pupil of the projection optical unit 10 regularly cannot be exactly illuminated with the second facet mirror 22. When imaging the projection optical unit 10, which images the center of the second facet mirror 22 telecentrically onto the wafer 13, the aperture rays often do not intersect at a single point. However, it is possible to find an area in which the spacing of the aperture rays that is determined in pairs becomes minimal. This area represents the entrance pupil or an area in real space that is conjugate thereto. In particular, this area has a finite curvature.

It may be the case that the projection optical unit 10 has different poses of the entrance pupil for the tangential beam path and for the sagittal beam path. In this case, an imaging element, in particular an optical component of the transfer optical unit, should be provided between the second facet mirror 22 and the reticle 7. With the aid of this optical element, the different poses of the tangential entrance pupil and the sagittal entrance pupil can be taken into account.

In the arrangement of the component parts of the illumination optical unit 4 shown in FIG. 1, the second facet mirror 22 is arranged in an area conjugate to the entrance pupil of the projection optical unit 10. The first facet mirror 20 is arranged tilted in relation to the object plane 6. The first facet mirror 20 is arranged tilted in relation to an arrangement plane defined by the deflection mirror 19. The first facet mirror 20 is arranged tilted in relation to an arrangement plane defined by the second facet mirror 22.

The trend in the case of projection optical units 10 as mentioned above is toward larger dimensions of the mirrors M1 to M6 or of at least some of the mirrors M1 to M6. For example, if such mirrors M1 to M6 are used with a greater diameter, then their thickness would have to increase quadratically with diameter, i.e. the volume would have to increase with the fourth power, according to:

$$\text{volume} \propto \text{diameter}^4$$

This quickly becomes prohibitive since both the costs of the mirror substrate and the mirror masses are proportional to their volume to a good approximation. Larger mirrors M1 to M6 in future projection optical units 10 would thus desirably be thinner than the actual requirements according to the scaling described here. However, the mirrors become "wobblier" as a consequence.

How "wobbly" such a mirror M1 to M6 is can be quantified by way of its eigenfrequencies. The eigenfrequencies scale according to $$eigenfrequencies \propto \frac{thickness^2}{diameter}$$

with the mirror geometry, with lower eigenfrequencies corresponding to a wobblier mirror M1 to M6.

The criterion for "being wobbly" is the number of eigenmodes whose eigenfrequency is located below a certain critical frequency. In particular, this critical frequency depends on excitations introduced from externally, on the accelerations created on purpose by the possible actuator systems and on the damping of the mirror material. To date, the mirrors M1 to M6 have typically been designed such that all eigenfrequencies are located just above the critical frequency; i.e. the mirrors M1 to M6 are inherently stiff.

A global change in the mirror geometry, in particular an increase in the diameter and a reduction in the thickness, scales all eigenfrequencies with the same factor. It is now possible to count the number of eigenmodes for which the corresponding eigenfrequency drops below the critical frequency. For given values of thickness and diameter, this depends on the shape of the mirror M1 to M6.

The aforementioned "wobbling" can be counteracted with the aid of active closed-loop control. During a vibration period, the respective mirror M1 to M6 is locally deflected and locally experiences a certain velocity and/or acceleration. The acceleration is relevant to the effect that typical actuators are able to apply a force. If this force opposes a current actual acceleration, then the vibration amplitude is damped.

For example, actuators can be arranged at positions of anti-nodes of an eigenmode. However, normally this is neither necessary nor—at least if a plurality of eigenmodes are excited—possible since the anti-nodes of different eigenmodes are typically located at different locations. The vibrations can be damped if, at suitable times and at suitable locations, a force is exerted on the respective mirror M1 to M6 by an actuator. In any case, such an exertion of force is helpful for damping the vibrations.

To be able to damp the vibrations of the eigenmodes via closed-loop control, it is desirable to know their vibration phases in addition to their current vibration amplitudes. However, this is not mandatory. In principle, the vibration phase alone would be sufficient. The vibration amplitude is very helpful but not necessarily required. All eigenmodes should always be damped when an actuator is applied. Accordingly, the case where one eigenmode is damped and the other is excited should not occur. Accordingly, the aim is to make available an optical solution for determining the current actual amplitudes and actual phases of the excited or excitable eigenmodes.

Figure 2:
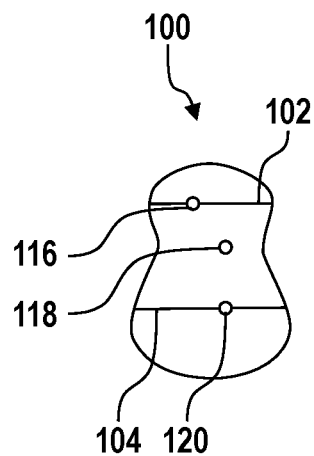
FIG. 2 shows a plurality of schematic views of an embodiment of a mirror.
Figure 2:
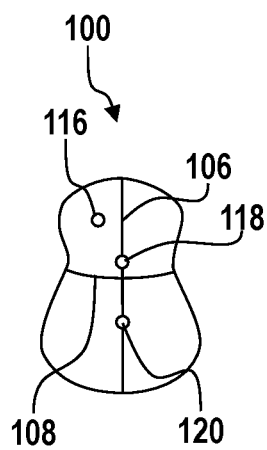
Figure 2:
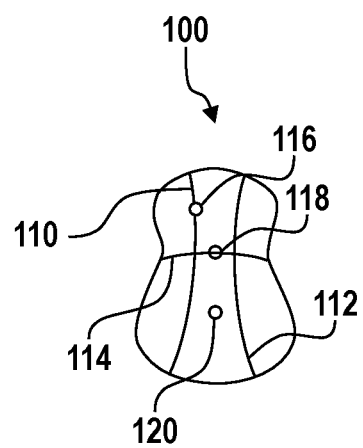

By way of example, FIG. 2 shows a thin mirror 100 with eigenmodes at 60 Hz (top), 72 Hz (center) and 95 Hz (bottom). For example, the mirror 100 can be one of the mirrors M1 to M6. The form of the eigenmodes and the corresponding eigenfrequencies can be calculated in advance. In FIG. 2, lines 102, 104, 106, 108, 110, 112, 114 each mark locations at which the amplitude of the respective natural vibration is zero. It is not only possible to calculate the eigenmodes, but these can also be measured by virtue of the mirror 100 being excited at variable frequencies. An equivalent for acoustic oscillations would be so-called Chladni figures.

To be able to separate N eigenmodes in a measurement it is desirable to have at least N measurement positions 116, 118, 120, as shown in FIG. 2. It may be desirable to choose the measurement positions 116, 118, 120 such that the amplitude vanishes at the measurement positions 116, 118, 120 for at least some of the eigenmodes. This then facilitates the assignment of the measurement results to the individual eigenmodes.

The amplitude vanishes accordingly at those measurement positions 116, 118, 120 which are located on one of the lines 102, 104, 106, 108, 110, 112, 114. This applies to the measurement positions 116, 120 in the upper partial figure of FIG. 2. This applies to the measurement positions 118, 120 in the central partial figure of FIG. 2. This applies to the measurement positions 116, 118 in the lower partial figure of FIG. 2.

Figure 3:
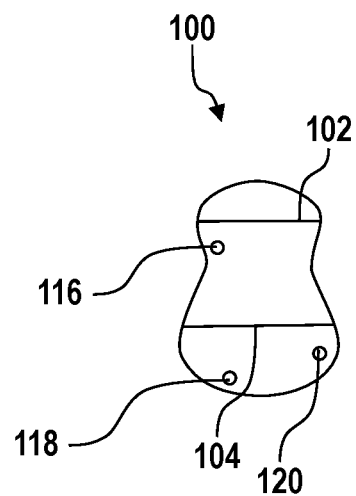
FIG. 3 shows further schematic views of the mirror according to FIG. 2.
Figure 3:
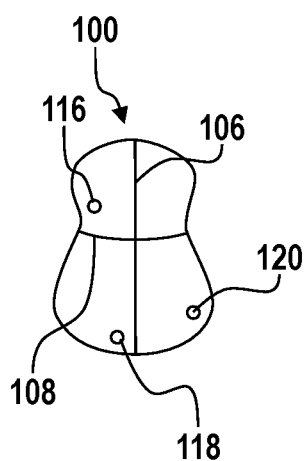
Figure 3:
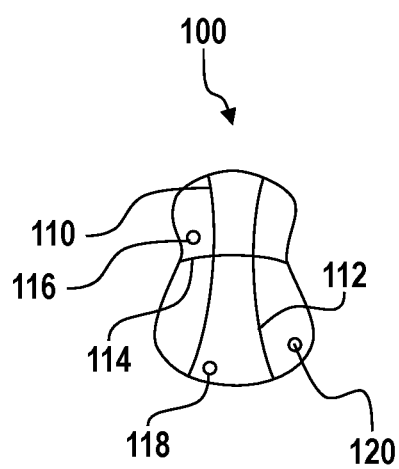

On the contrary, however, it may also be desirable for all eigenmodes to contribute at each measurement position 116, 180, 120 as the overall measurement result determined for an eigenmode is thus based on as many individual measurement results as possible, as depicted in FIG. 3. As shown in FIG. 3, none of the measurement positions 116, 118, 120 are located on any of the lines 102, 104, 106, 108, 110, 112, 114.

Figure 4:
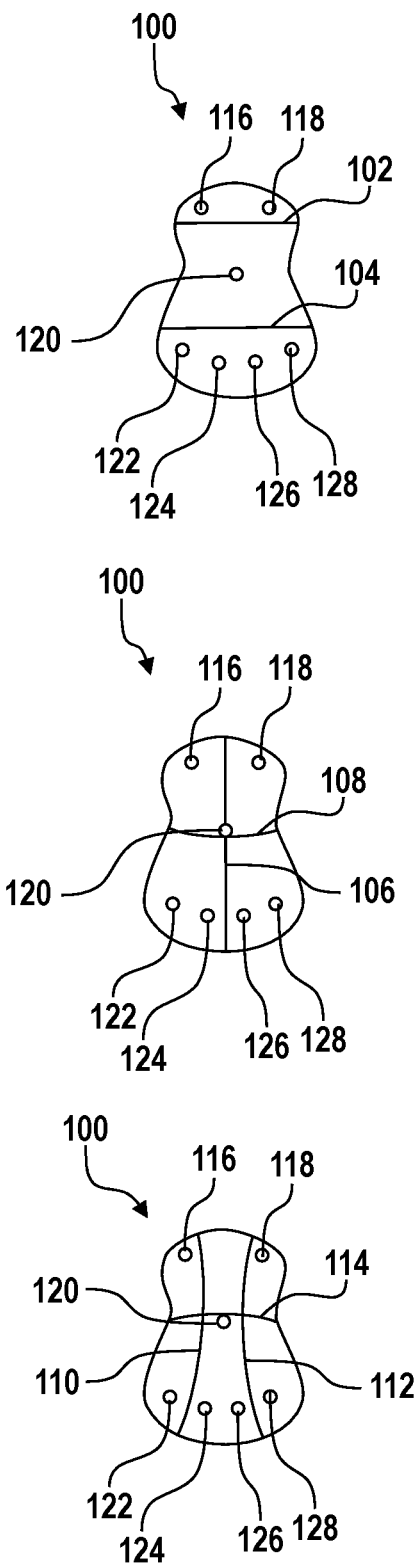
FIG. 4 shows further schematic views of the mirror according to FIG. 2.

As shown in FIG. 4, it is also possible to use more measurement positions 116, 118, 120, 122, 124, 126, 128 than there are eigenmodes to be controlled. This increase may lead to a more accurate overall result.

To be able to now detect the vibration phases and vibration amplitudes, different points on a used mirror surface of the mirror 100 are measured from "the front" using an interferometer in each case. In the present case, from "the front" means viewing the used mirror surface. In the present case, the "used mirror surface" should be understood to mean the mirror surface at which the used EUV radiation or illumination radiation 16 is reflected. The used mirror surface is always curved since the illumination radiation 16 should be imaged with the aid thereof.

Figure 5:
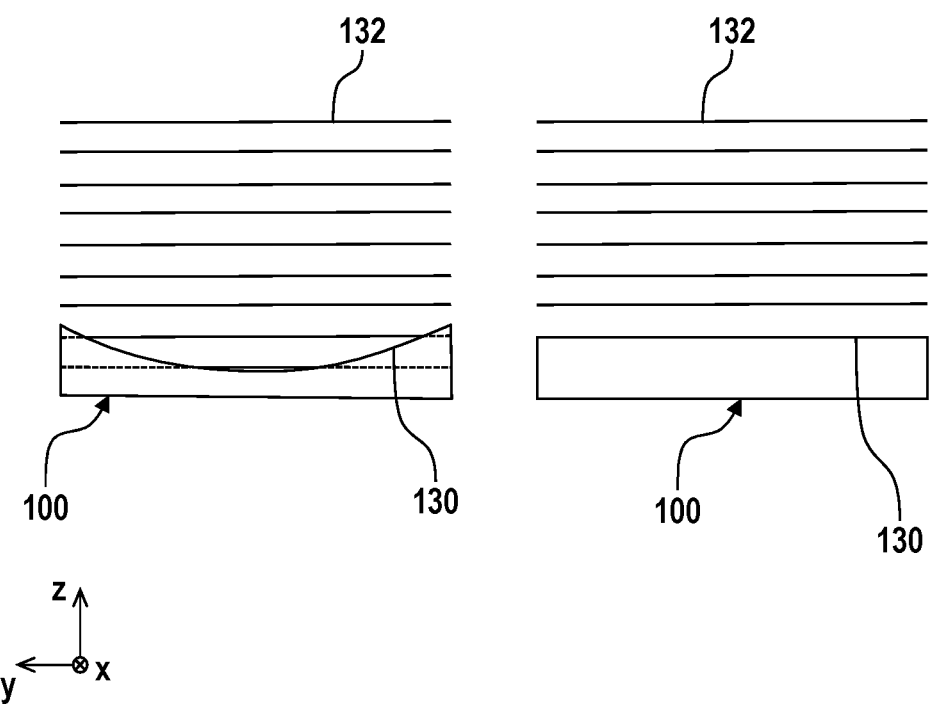
FIG. 5 shows schematic views of two embodiments of a mirror.

FIG. 5 shows a mirror 100 with a front-side used mirror surface 130. The used mirror surface 130 may also be referred to as optically effective surface or optically active surface. In the orientation of FIG. 5, a mirror 100 with a curved used mirror surface 130 is shown to the left and a mirror 100 with a plane used mirror surface 130 is shown to the right.

A coordinate system with a first spatial direction or x-direction, a second spatial direction or y-direction and a third spatial direction or z-direction is assigned to the mirror 100. The directions are oriented perpendicularly to one another. The mirror 100 as a whole has six degrees of freedom, namely three translational degrees of freedom in the x-direction, the y-direction and the z-direction, respectively, and three rotational degrees of freedom about the x-direction, the y-direction and the z-direction, respectively. If the mirror 100 can deform dynamically in particular, it can be ascribed further degrees of freedom.

The "position" of the mirror 100 should be understood to mean its coordinates or the coordinates of a measurement point attached to the mirror 100, with respect to the x-direction, the y-direction and the z-direction. In particular, the "orientation" of the mirror 100 should be understood to mean its tilt in relation to the x-direction, the y-direction and the z-direction. In the present case, the "pose" should be understood to be both the position and the orientation of the mirror 100. In the present case, "adjusting" or "aligning" should be understood to mean that the mirror 100 is brought from an actual pose to a target pose. The pose, in particular the target pose, of the mirror 100 can be subject to open-loop or closed-loop control.

In the present case, "open-loop control" or "closed-loop control" should be understood to mean, in particular, the practice of actively ensuring that actual poses and target poses do not deviate from one another, or only deviate insubstantially from one another. Open-loop control of the "pose" of the mirror 100 should be understood to mean not only the open-loop control of the aforementioned six rigid body degrees of freedom of the mirror 100 but also the suppression of mirror vibrations as this is the only way that the actual poses of any desired points on the used mirror surface 130 correspond to their target poses.

An interferometer not shown in FIG. 5 sends out a measurement beam. For example, this measurement beam can be described by its used wavefront 132. The measurement beam propagates from the interferometer to the mirror 100 and back to the interferometer. The interferometer measures the distance from the mirror 100 in units of wavelength, i.e. in units of the spacing between the used wavefronts 132. In the case of a plane mirror 100, as depicted in the right partial figure of FIG. 5, the same measured distance arises over the entire width of the used wavefront 132.

By contrast, if the mirror 100 is curved, as depicted in the left partial figure of FIG. 5, different measured distances arise over the width of the used wavefront 132. If the used wavefront 132 has a half-diameter or radius of r and if the local radius of curvature of the mirror 100 is denoted by R, then a height profile difference Δz of the mirror 100 as given below arises at the edge of the used wavefront 132:

$$\Delta z = \frac{r^2}{2R}$$

The optical path length difference Δd is twice this value, i.e.:

$$\Delta d = \frac{r^2}{R}$$

A typical value for the diameter of the used wavefront 132 of the interferometer is at least 1 mm, i.e. r=0.5 mm. A typical local radius of curvature is R=1 m. From this, a path length difference of Δd=250 nm, i.e. approximately half the wavelength of the interferometer, arises over the used wavefront 132. Different regions of the used wavefront 132 thus lead to opposite interference, rendering an accurate measurement impossible.

Some interferometers even have a beam diameter of approximately 6 mm, wherefore the effect is even stronger by a factor of 36. Thus, many regions with constructive interference and many regions with destructive interference are present over the cross section of the used wavefront 132. Thus, care has to be taken that all regions of the used wavefront 132 with identical information contribute to the measurement signal in the interferometer.

The just described path length differences over the used wavefront cross section can be avoided if the used wavefronts 132 are locally oriented in parallel with the used mirror surface 130 upon incidence on the curved used mirror surface 130. In a geometric-optical representation, this is equivalent to beams each being incident on the used mirror surface 130 perpendicularly.

Figure 6:
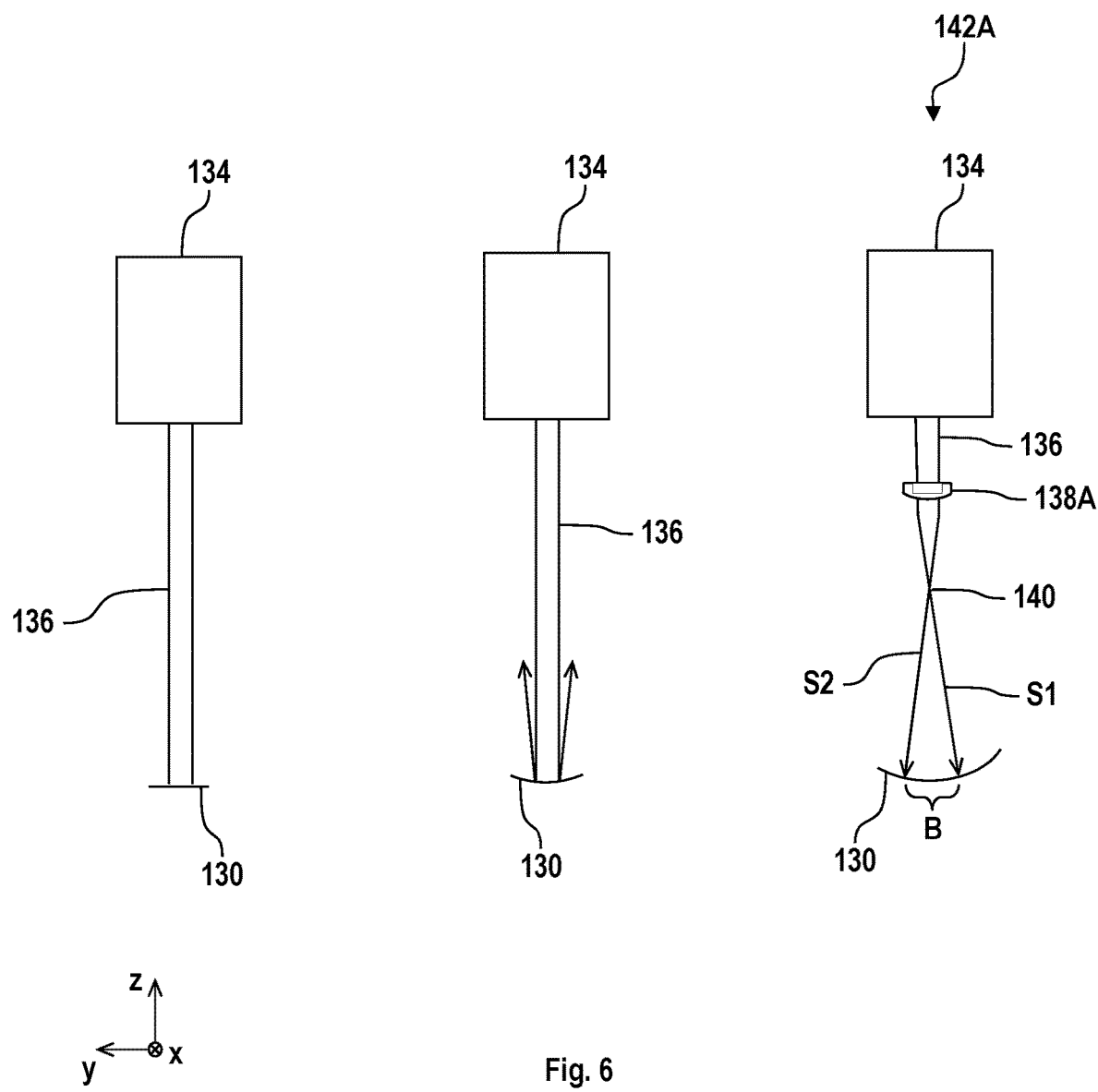
FIG. 6 shows schematic views of a plurality of embodiments of a measuring arrangement.

FIG. 6 shows an interferometer 134 which, with the aid of a measurement beam 136, measures the distance from a mirror 100 as mentioned above, of which only the used mirror surface 130 is depicted in FIG. 6. In the case of a plane mirror 100, as depicted to the left in FIG. 6, the measurement can be implemented directly via the measurement beam 136, in particular a collimated laser beam. By contrast, as depicted centrally in FIG. 6, such a measurement beam 136 no longer propagates back on itself if it is incident on a curved mirror 100. The central partial figure of FIG. 6 shows the situation where the curved used mirror surface 130 is measured directly via a commercially available interferometer 134. With regards to the used wavefront 132, this situation has already been described above. The beams would be deflected in a wrong direction in the intensity pattern. However, as depicted to the right of FIG. 6, this can be avoided by way of suitable beam shaping.

This can be achieved by way of a suitable beam shaping unit 138A, as depicted in the right partial image in FIG. 6. The beam shaping unit 138A can be embodied as a refractive element, in particular as a lens element. Since the curved used mirror surface 130 can be described locally as an ellipsoid, i.e. it has different radii of curvature in different directions, a surface of the beam shaping unit 138A also has different refractive powers in different directions. For the sake of a simpler illustration, only the section in a plane is considered here. An intermediate focus 140 is provided. The interferometer 134 and the beam shaping unit 138A form a measuring arrangement 142A.

Let a be a working distance between the beam shaping unit 138A and the mirror 100. Let r be the local radius of curvature of the mirror 100. Then, the beam shaping unit 138A creates a focus at the distance a–r. An ideal focus of radiation incident in parallel is created not by a spherical lens element but by a hyperboloid. A hyperboloid is a special case of a conic section. A conic section has the following general form:

$$z(h) = \frac{\rho h^2}{1 + \sqrt{1 - (1+k)(\rho h)^2}}$$

The quantity h is the so-called beam height, i.e. the distance from the optical axis. The parameter k is referred to as the conic constant. If the beam shaping unit 138A consists of a material with refractive index n, the involved parameters of the conic section arise as:

$$\rho = -\frac{1}{n-1} \cdot \frac{1}{a-r}$$
$$k = -n^2$$

The beam shaping unit 138A is suitable for shaping the measurement beam 136 of the interferometer 134 such that light rays S1, S2 of the measurement beam 136 are oriented at right angles to the used mirror surface 130 at each point in a region B in which the measurement beam 136 is incident on the used mirror surface 130. Only marginal light rays S1, S2 are plotted in the right partial figure of FIG. 6. However, this applies to all light rays S1, S2 incident on the used mirror surface 130 in the region B. In other words, the used wavefronts 132 are locally oriented parallel to the used mirror surface 130 upon incidence on the curved used mirror surface 130.

Figure 7:
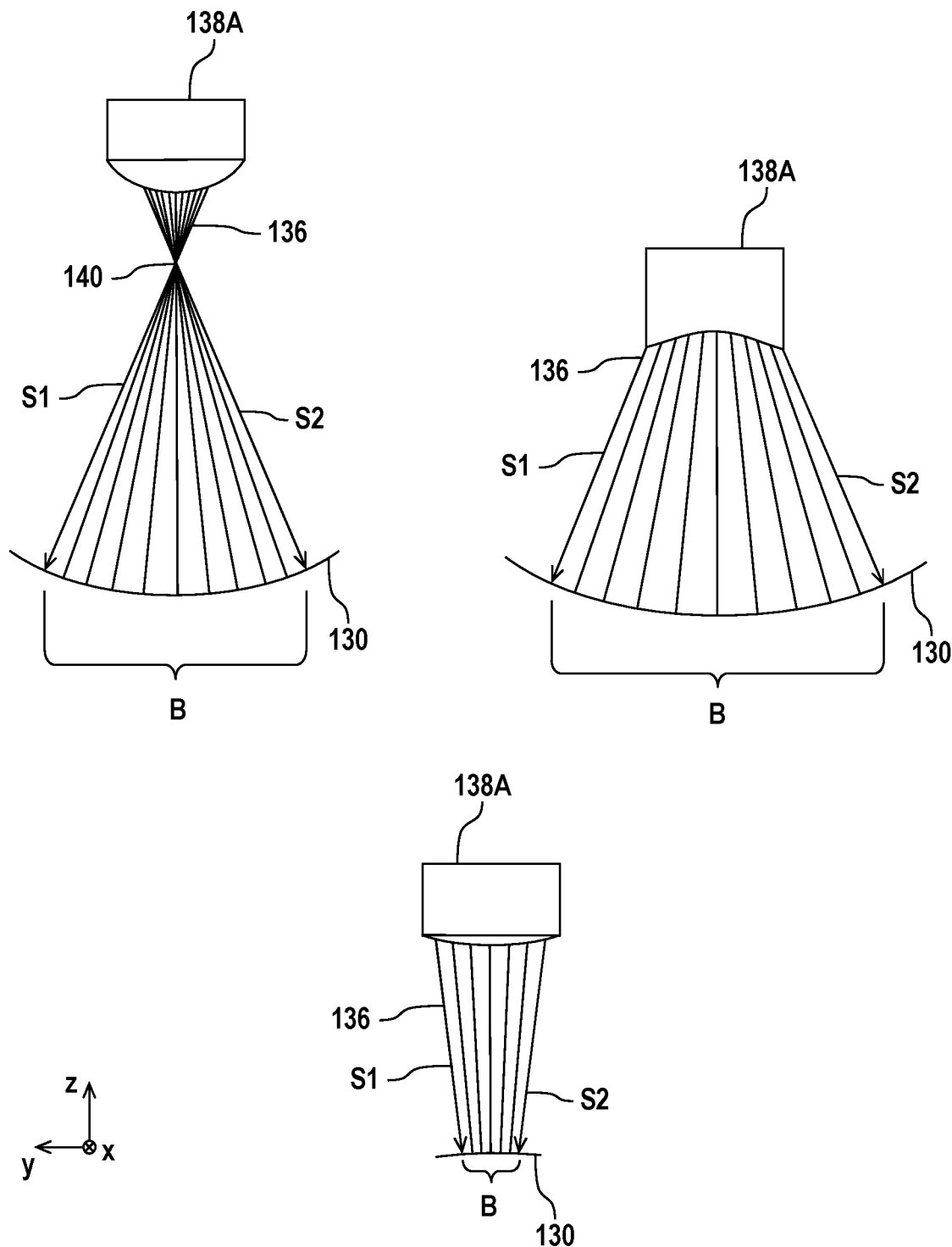
FIG. 7 shows schematic views of a plurality of embodiments of a beam shaping unit.

FIG. 7 shows three situations which may occur and which are all described by the equations just specified. In the case of a concave mirror 100 there are situations with (left partial figure) intermediate focus 140 and without intermediate focus 140 (right partial figure), whereas only the situation without intermediate focus 140 may occur in the case of a convex mirror 100 (bottom partial figure). An intermediate focus 140 occurs precisely if r>a. That is to say, this is not a degree of freedom of design.

Figure 8:
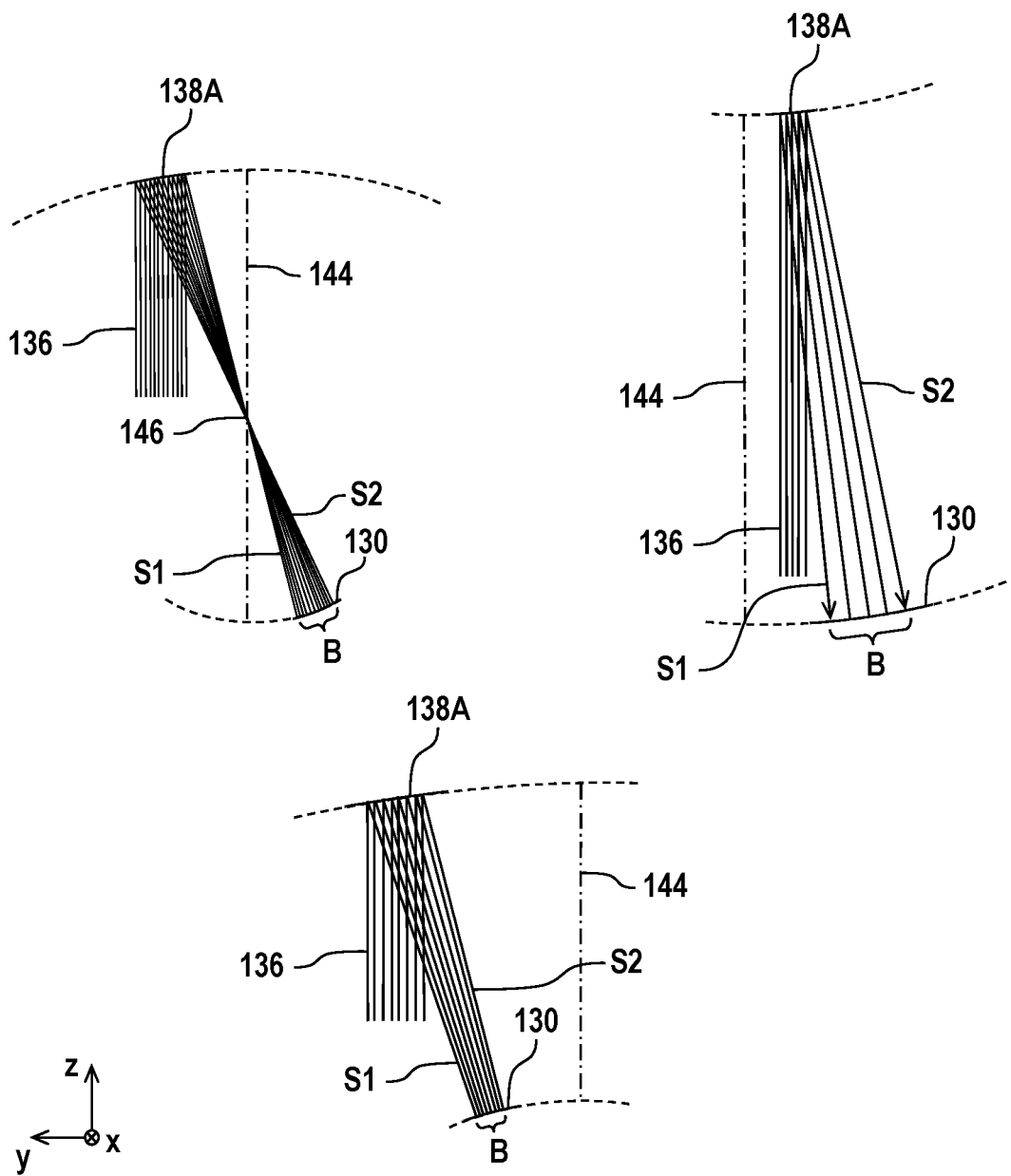
FIG. 8 shows schematic views of embodiments of a beam shaping unit.

FIG. 8 shows the reproduction of the beam paths from FIG. 7 with reflective beam shaping. That is to say, the beam shaping unit 138A does not have refractive properties but reflective properties. The three conceivable beam paths for illuminating the mirror 100 via a reflective beam shaping unit 138A are realized in FIG. 8. The actually used reflective regions are depicted using solid lines. To demonstrate that this is a rotationally symmetric system used off axis, the continuation of the reflective surfaces is depicted using dashed lines and an optical axis 144 is depicted using a dash-dotted line.

A respective real focus 146 is created by the beam shaping unit 138A in each of the left and the lower partial figure of FIG. 8, the real focus once being located in front of and once being located behind the used mirror surface 130 of the mirror 100. In both cases, the involved parameters of the surface shape of the beam shaping unit 138A are given by:

$$\rho = -\frac{1}{2} \cdot \frac{1}{a-r},$$
$$k = -1$$

In this case, a conic constant k=−1 means that a paraboloid is present. By contrast, a virtual focus is located behind the beam shaping unit 138A in the right partial figure of FIG. 8. In this case, the sign of the curvature should be inverted:

$$\rho = \frac{1}{2} \cdot \frac{1}{a-r}, k = -1$$

In principle, there is also a diffractive option for beam shaping in addition to a reflective and a refractive option. The problem to be solved by the beam shaping unit 138A is that of providing an illumination on a surface to be measured, the illumination being such that the light rays S1, S2 are incident perpendicularly all over the region B to be measured. However, this is also exactly the problem solved by a CGH (computer-generated hologram=a specific design and production method for a diffractive optical element) if the latter is used as described in DE 10 2019 219 209 A1.

Figure 9:
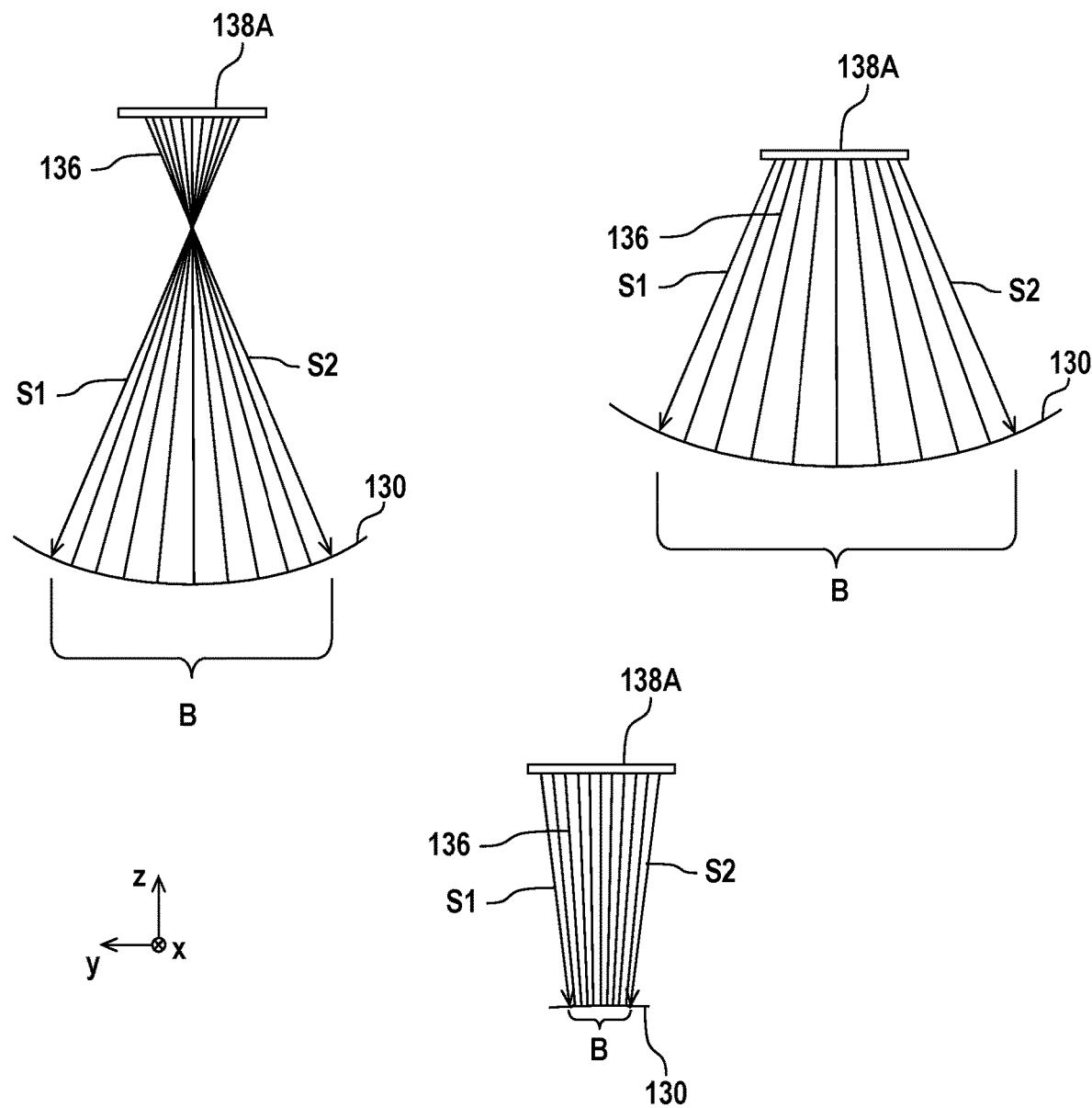
FIG. 9 shows schematic views of embodiments of a beam shaping unit.

FIG. 9 shows how the corresponding beam paths can also be attained via a beam shaping unit 138A in the form of a diffractive optical element (CGH). As shown by FIG. 9 with its three partial figures, there are also three fundamentally different options here.

Figure 10:
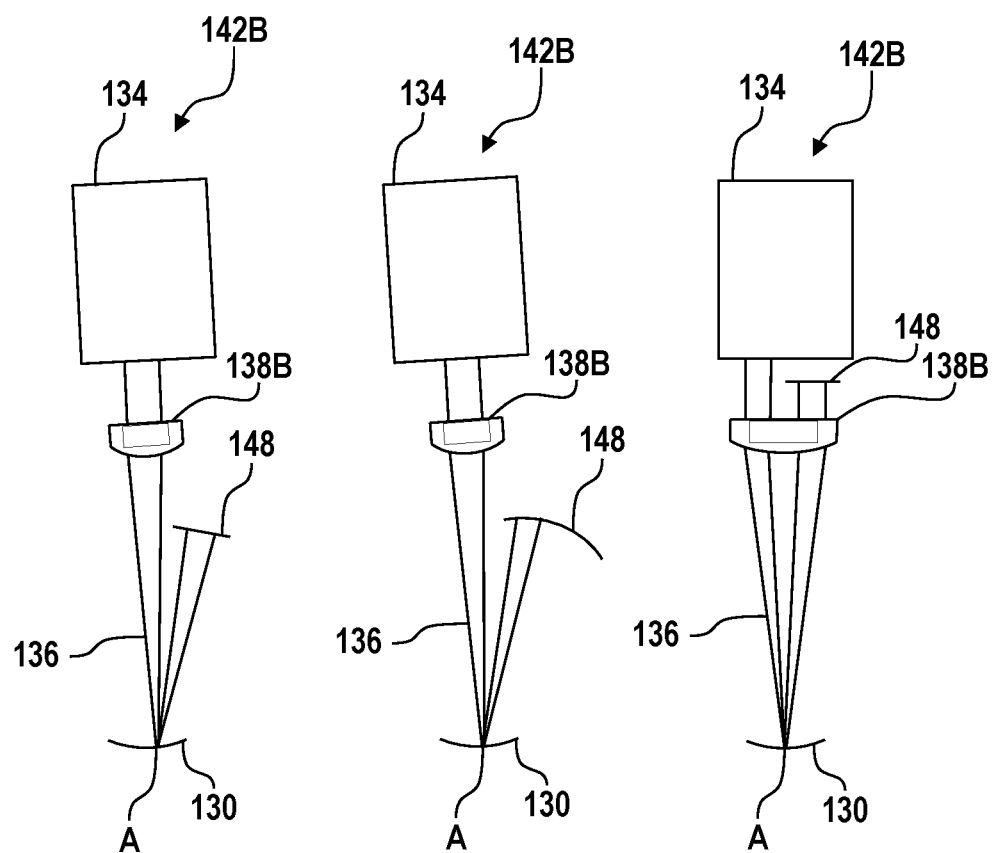
FIG. 10 shows schematic views of embodiments of a measuring arrangement.

FIG. 10 shows an alternative option for measuring the distance. The problem of the optical path length varying over the cross section of the used wavefront 132 (FIG. 5) can also be circumvented by virtue of simply making this cross section very small. To this end, the measurement beam 136 can be focused on the mirror 100 or on the used mirror surface 130. A reflector mirror 148 then ensures that the measurement beam 136 propagates back on itself again.

In an alternative embodiment of a measuring arrangement 142B according to FIG. 10, provision is made of a beam shaping unit 138B in the form of a refractive optical element, i.e. in the form of a lens element. The reflector mirror 148 is plane in the left and right partial figure of FIG. 10, whereas the reflector mirror 148 is curved in the central partial figure of FIG. 10. The measurement beam 136 reflected at the mirror 100 can be guided back to the reflector mirror 148 through the beam shaping unit 138B.

To obtain an interference in the interferometer 134, the measurement beam 136 propagates back to the interferometer 134 again. This is achieved by the additional reflector mirror 148. If the latter is plane, as shown in the left partial figure of FIG. 10, then this however leads to a deterioration in the measurement quality in a manner analogous to what was described previously in relation to FIG. 5. This can be prevented by virtue of the reflector mirror 148 being equipped with refractive power (central partial figure of FIG. 10) or being arranged downstream of an optical element provided with refractive power. In the right partial figure of FIG. 10, this optical element provided with refractive power is identical to the beam shaping unit 138B. However, this is not mandatory.

Figure 11:
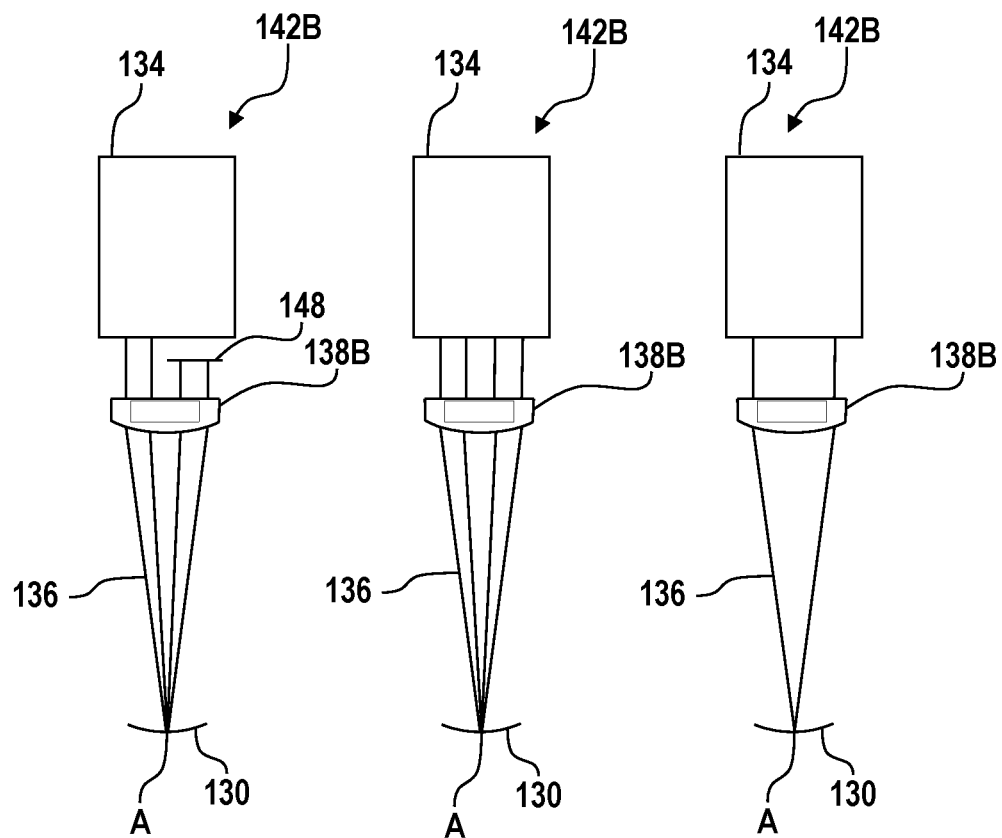
FIG. 11 shows schematic views of embodiments of a measuring arrangement.

FIG. 11 shows an alternative configuration of the measuring arrangement 142B, in which a reflector mirror 148 is dispensed with in the central and right partial figure. This can be achieved by virtue of the focused measurement beam 136 being incident on the mirror 100 or on the used mirror surface 130 at right angles and therefore propagating back on itself. In this case, the central partial figure of FIG. 11 is intended to provide motivation with regards to how to arrive at a structure without reflector mirror 148 (right partial figure of FIG. 11) starting from the left partial figure (corresponding to the right partial figure of FIG. 10).

Figure 12:
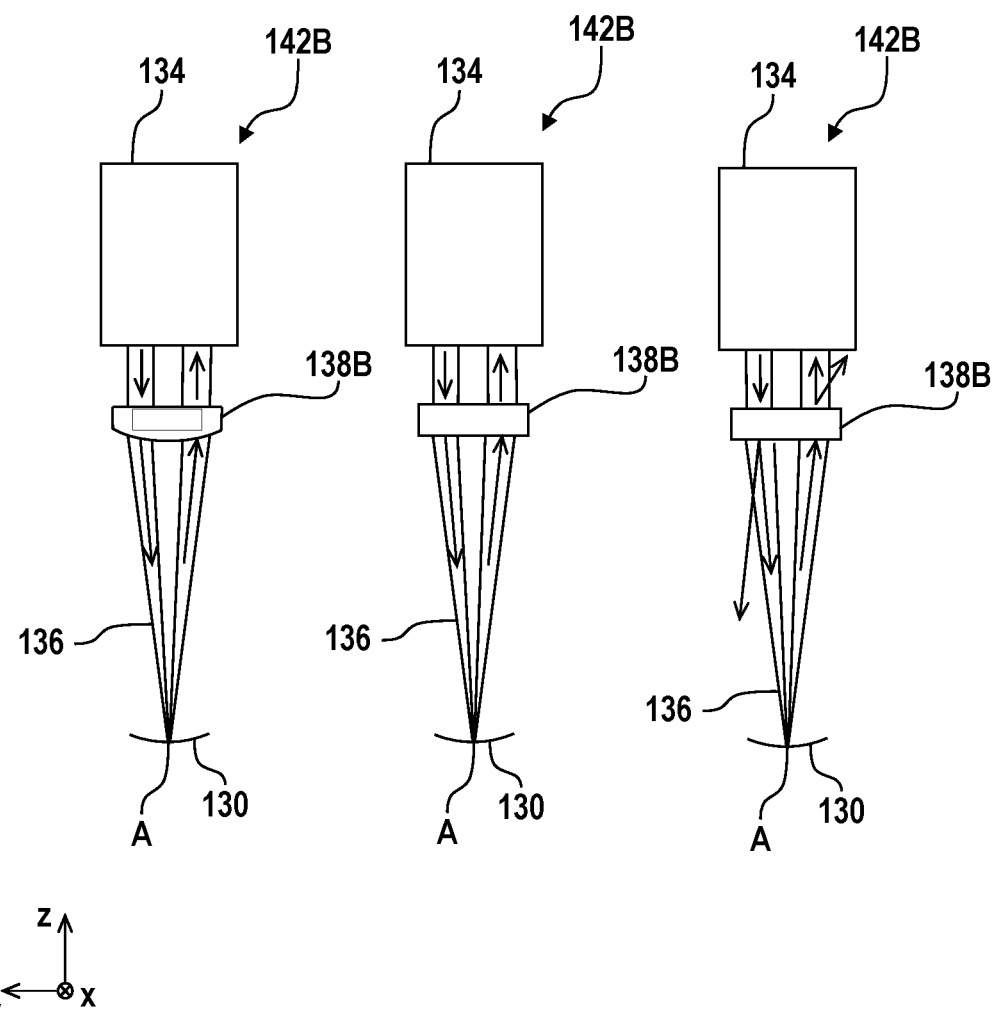
FIG. 12 shows schematic views of embodiments of a measuring arrangement.

FIG. 12 shows a further alternative configuration of the measurement arrangement 142B. In principle, a diffractive optical element can also be used as beam shaping unit 138B instead of a refractive lens element as beam shaping unit 138B. The structure according to the central partial figure of FIG. 11 is depicted as a diffractive structure in FIG. 12. That is to say the beam shaping unit 138B is a diffractive optical element.

The left partial figure of FIG. 12 shows a beam shaping unit 138B in the form of a refractive lens element, as is also depicted in the central partial figure of FIG. 11. The beam shaping unit 138B is a diffractive optical element in the central and the right partial figure of FIG. 12. If the beam shaping unit 138B is realized as a binary grating (right partial figure of FIG. 12), then the energy distribution among the orders of diffraction is symmetrical, with the result that half of the light of the measurement beam 136 is always deflected exactly oppositely (indicated by the black arrows). However, the desired effect can be obtained by a continuous phase function (central partial figure of FIG. 12).

However, diffractive optical elements are usually binary (right partial figure of FIG. 12). In the present case, "binary" should be understood to mean that, in particular, a phase difference of 0 or π is introduced depending on the location on the element. This typically leads to the orders of diffraction being symmetrical, i.e. deflecting the same amount of energy to the "left" as to the "right". As a result, at most half of the light in the measurement beam 136 is deflected in the desired direction. Thus, at most a quarter of the light follows the desired path in the event of such an element being passed twice.

Figure 13:
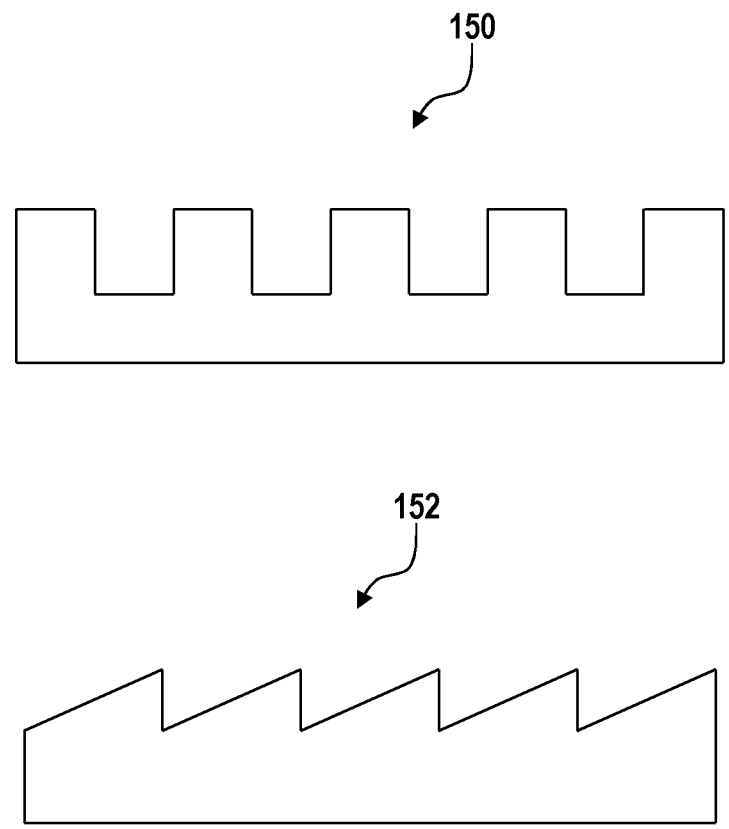
FIG. 13 shows schematic views of a plurality of embodiments of a diffractive optical element.

FIG. 13 shows a binary grating 150 (upper partial figure) and a blazed grating 152 or echelette grating (lower partial figure). In principle, the beam shaping unit 138B in the form of a diffractive optical element may also be provided locally with a suitable blazed grating. The introduced phase difference then no longer has discontinuities, and it is possible, at least in principle, to deflect all the light of the measurement beam 136 as desired.

Figure 14:
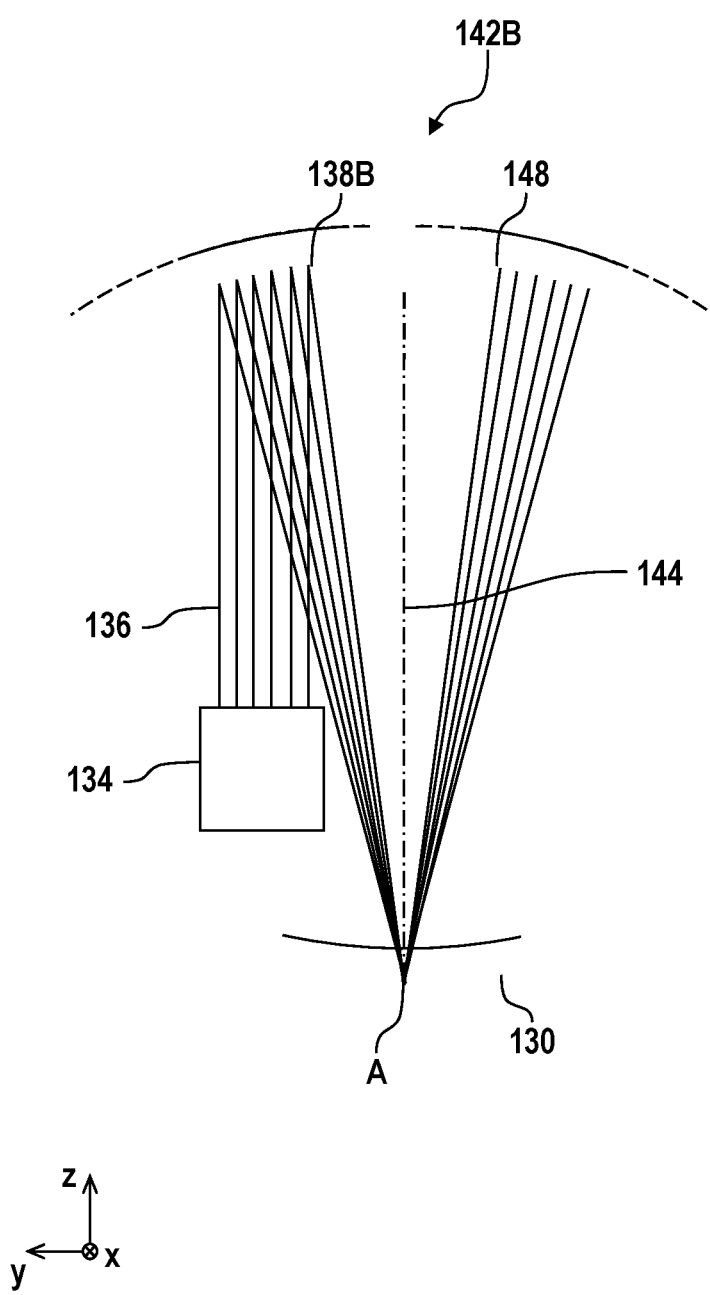
FIG. 14 shows a schematic view of an embodiment of a measuring arrangement.

FIG. 14 shows a further alternative configuration of the measurement arrangement 142B. In this case, a reflective mirror is used as beam shaping unit 138B. In this case, the beam shaping unit 138B has the shape of a paraboloid:

$$\rho = -\frac{1}{2} \cdot \frac{1}{a}, k = -1$$

In this case, the reflector mirror 148 is a sphere of radius a. The measurement beam 136 propagating back on itself, as depicted in the right partial figure of FIG. 11, is not possible on a reflective basis here since the beam shaping unit 138B and the mirror 100, of which only the used mirror surface 130 is depicted in FIG. 14, would shadow one another.

Different embodiments of the measuring arrangement 142B were explained in the preceding paragraphs. These measuring arrangements 142B could be distinguished according to whether the mirror 100 to be measured or the used mirror surface 130 is struck substantially at right angles or whether there is significant freedom with regard to the choice of the geometric arrangement. These two different classes are contrasted in FIG. 15.

Figure 15:
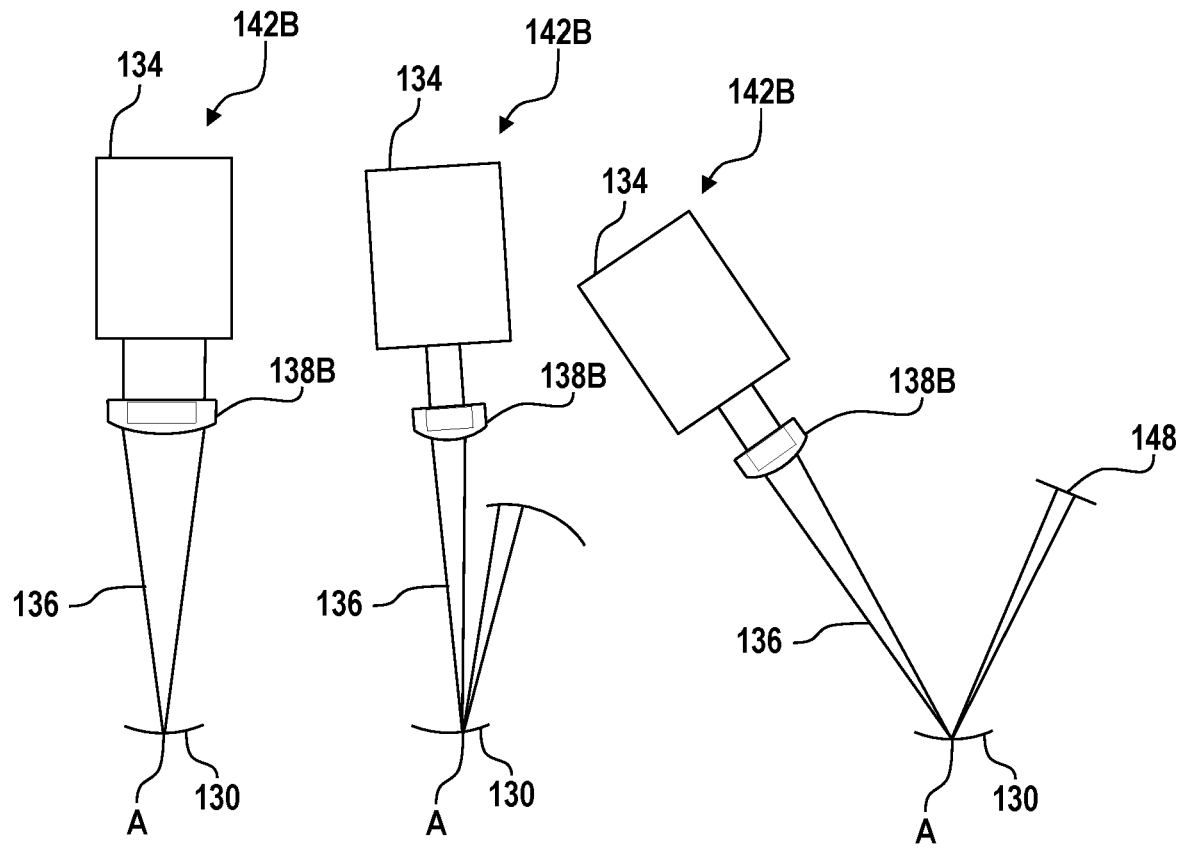
FIG. 15 shows schematic views of embodiments of a measuring arrangement.

The measuring arrangement 142B according to the left partial figure of FIG. 15 assumes that the mirror 100 or the used mirror surface 130 is struck at right angles. By contrast, the measuring arrangements 142B according to the central and the right partial figure of FIG. 15 allow free choice of the angle of incidence of the measurement beam 136 on the used mirror surface 130.

Figure 16:
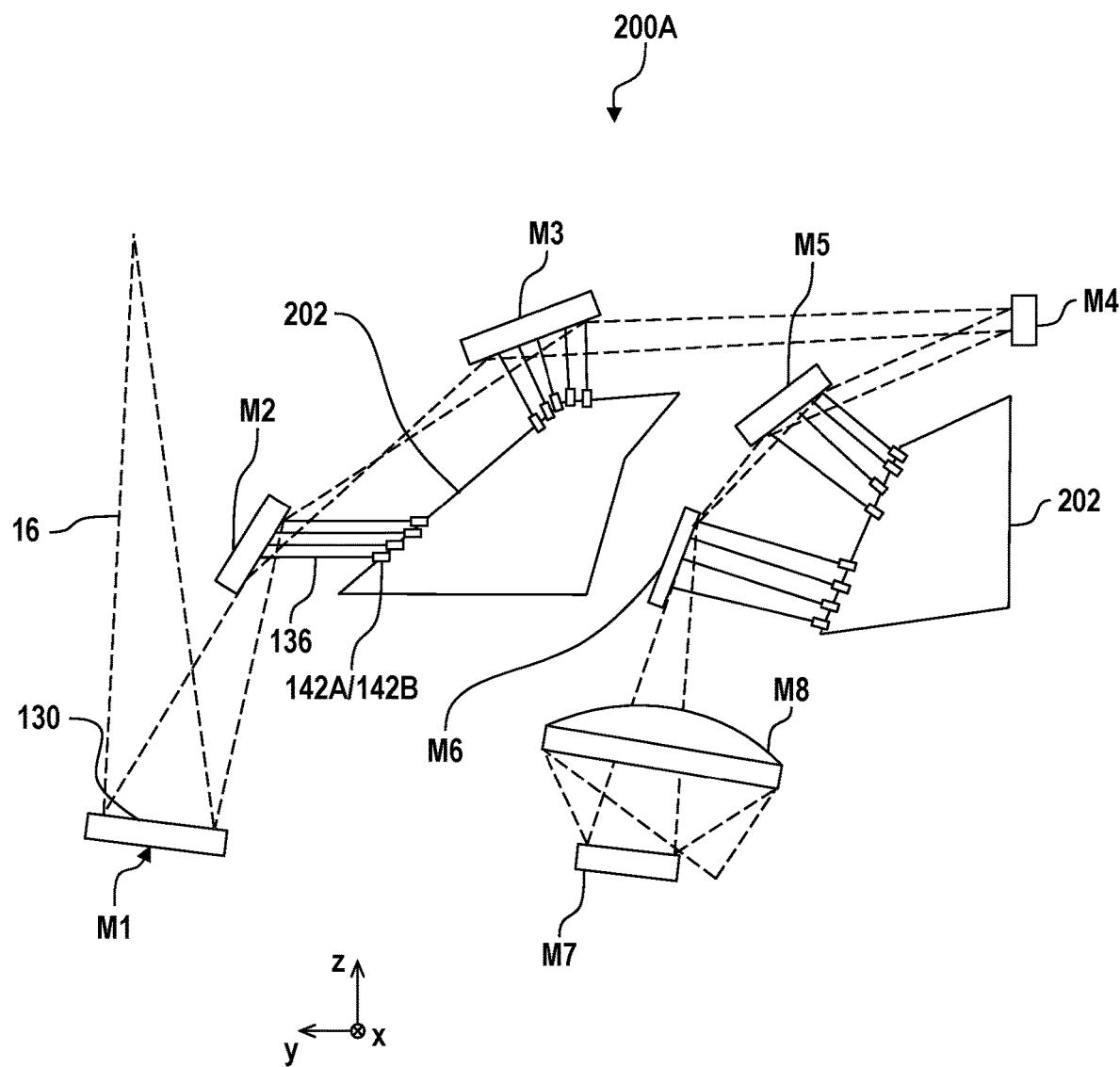
FIG. 16 shows a schematic view of an embodiment of an optical system.

FIG. 16 shows a schematic view of an embodiment of an optical system 200A. The optical system 200A is a projection optical unit 10 as mentioned above and may therefore also be referred to as such. The optical system 200A comprises a fixed reference 202. The fixed reference 202 is a sensor frame and is therefore also referred to as sensor frame 202 below.

In addition to the sensor frame 202, the optical system 200A comprises a plurality of mirrors M1, M2, M3, M4, M5, M6, M7, M8. The sensor frame 202 is located interiorly in relation to the mirrors M1, M2, M3, M4, M5, M6, M7, M8. That is to say all mirrors M1, M2, M3, M4, M5, M6, M7, M8 are replaceable as these cannot collide with the sensor frame 202 during a replacement, for example within the scope of a repair. However, this simultaneously also means that there is no external reference, from where the mirrors M1, M2, M3, M4, M5, M6, M7, M8 can be measured on the back side.

FIG. 16 shows an arrangement of the mirrors M1, M2, M3, M4, M5, M6, M7, M8 according to a first design type. FIG. 16 shows a meridional section of the optical system 200A. In this section, it appears as if two separate sensor frames 202 are provided. In actual fact the sensor frame 202 has the shape of a ring. In other words, the two depicted parts of the sensor frame 202 are interconnected in front of and behind the plane of the drawing.

A multiplicity of measuring arrangements 142A, 142B are attached to the sensor frame 202; however, only one thereof is provided with a reference sign in FIG. 16. The respective measurement beam 136 from the measuring arrangements 142A, 142B has a substantially perpendicular incidence on the used mirror surface 130 of the respective mirror M2, M3, M5, M6.

Figure 17:
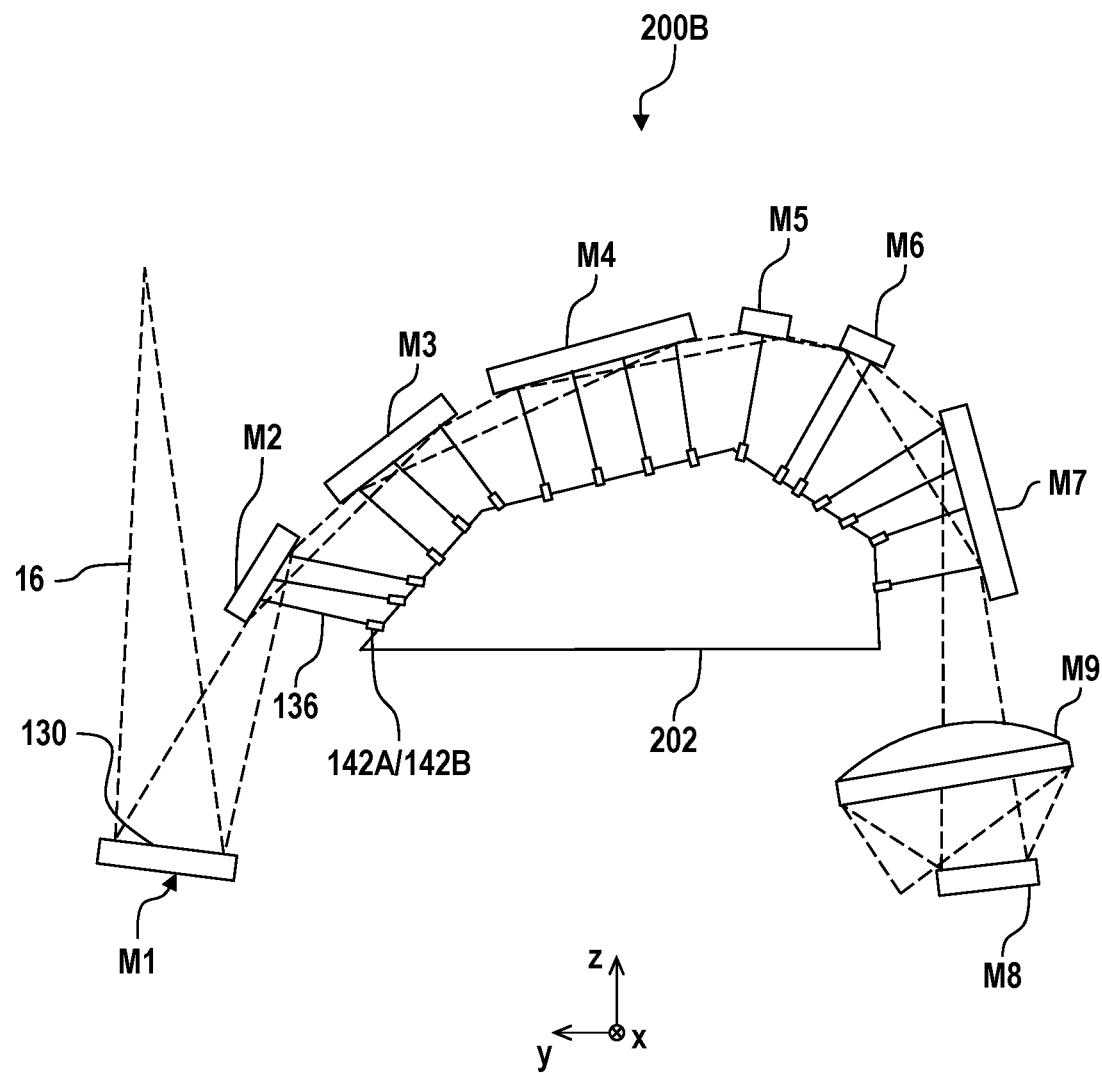
FIG. 17 shows a schematic view of an embodiment of an optical system.

FIG. 17 shows a schematic view of an embodiment of an optical system 200B. The optical system 200B is a projection optical unit 10 as mentioned above and may therefore also be referred to as such. The optical system 200A comprises a sensor frame 202 and a plurality of mirrors M1, M2, M3, M4, M5, M6, M7, M8, M9. The sensor frame 202 is located interiorly in relation to the mirrors M1, M2, M3, M4, M5, M6, M7, M8, M9.

A multiplicity of measuring arrangements 142A, 142B are attached to the sensor frame 202; however, only one thereof is provided with a reference sign in FIG. 17. The respective measurement beam 136 from the measuring arrangements 142A, 142B has a substantially perpendicular incidence on the used mirror surface 130 of the respective mirror M2, M3, M4, M5, M6, M7. FIG. 17 shows an arrangement of the mirrors M1, M2, M3, M4, M5, M6, M7, M8, M9 according to a second design type.

Figure 18:
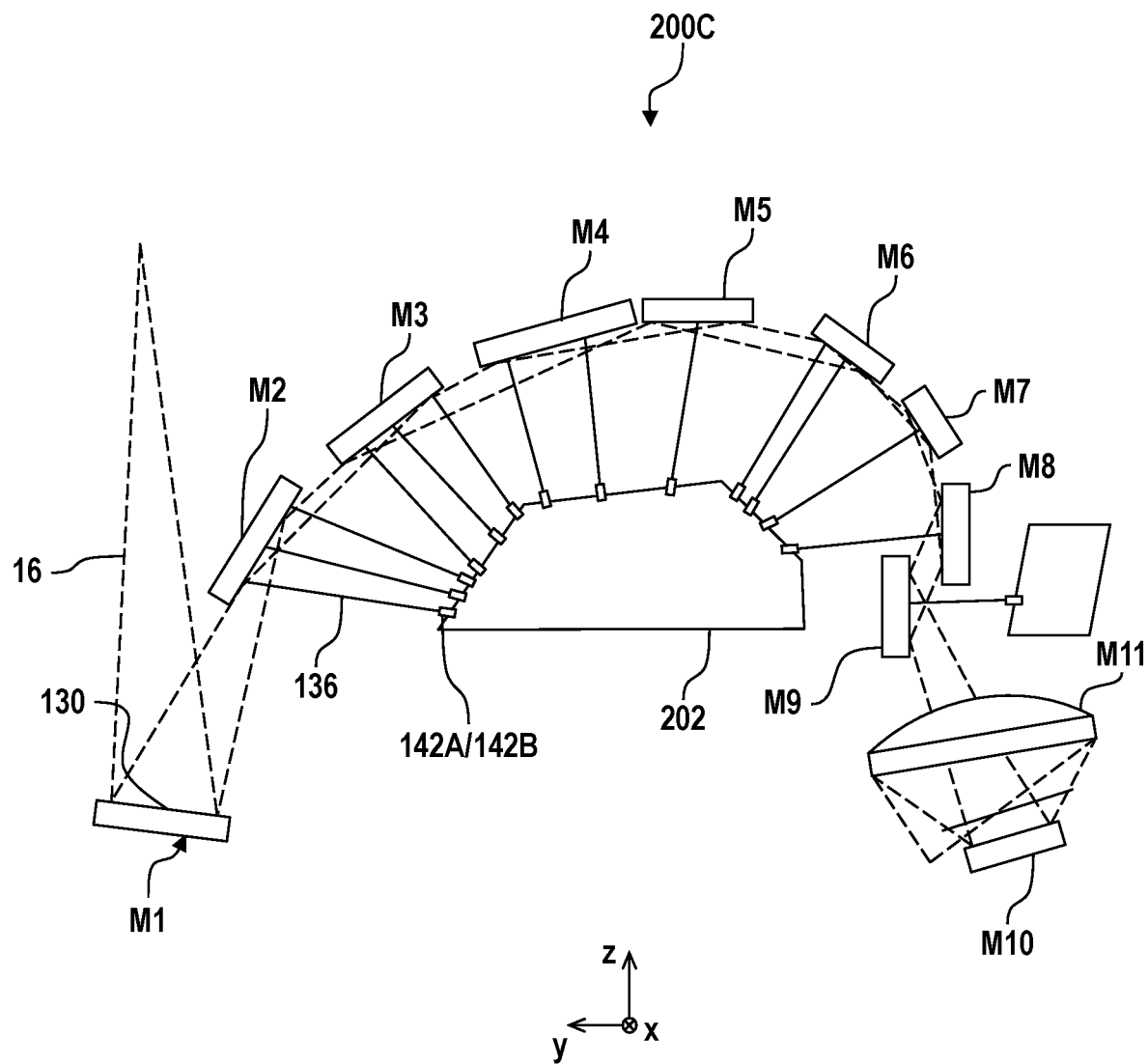
FIG. 18 shows a schematic view of an embodiment of an optical system.

FIG. 18 shows a schematic view of an embodiment of an optical system 200C. The optical system 200C is a projection optical unit 10 as mentioned above and may therefore also be referred to as such. The optical system 200C comprises a sensor frame 202 and a plurality of mirrors M1, M2, M3, M4, M5, M6, M7, M8, M9, M10, M11.

A multiplicity of measuring arrangements 142A, 142B are attached to the sensor frame 202; however, only one thereof is provided with a reference sign in FIG. 18. The respective measurement beam 136 from the measuring arrangements 142A, 142B has a substantially perpendicular incidence on the used mirror surface 130 of the respective mirror M2, M3, M4, M5, M6, M7, M8, M9. FIG. 18 shows an arrangement of the mirrors M1, M2, M3, M4, M5, M6, M7, M8, M9, M10, M11 according to a third design type.

Since the two last mirrors M7, M8 (FIG. 16), M8, M9 (FIG. 17) or M10, M11 (FIG. 18) of the respective optical system 200A, 200B, 200C would shadow one another, the measurement beam 136 cannot be incident thereon at right angles. As a result of using a reflector mirror 148 which can be arranged separately from the actual interferometer 134 of the measuring arrangement 142B (FIG. 10 and FIG. 15), it is however also possible to work with a measurement beam 136 that is not incident at right angles.

Figure 19:
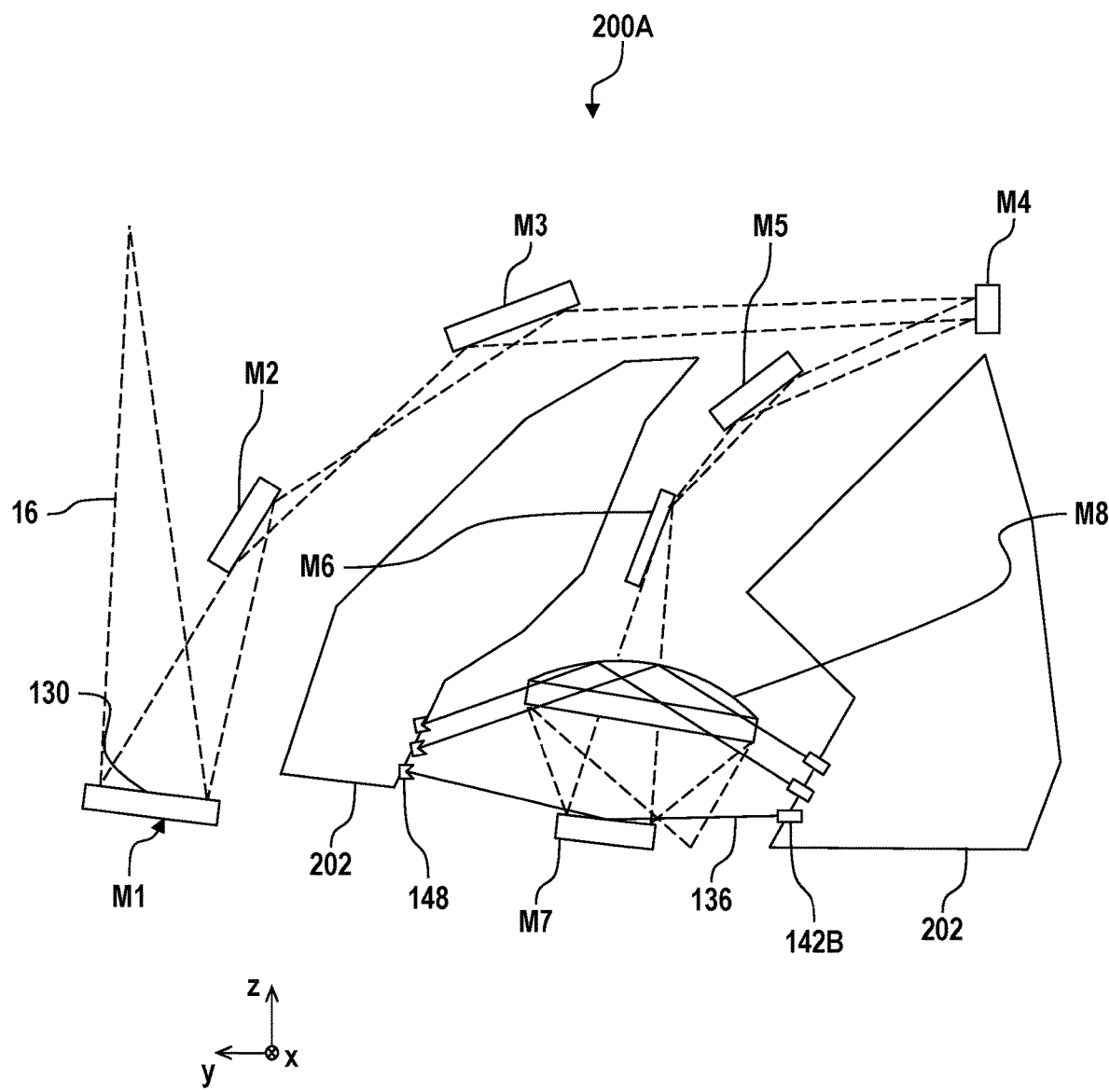
FIG. 19 shows a further schematic view of the optical system according to FIG. 16.

This is depicted in FIG. 19 on the basis of the optical system 200A. Since the surroundings of the last two mirrors M7, M8 appear very similar in all design types, only a single example, based on the first design type, is provided here. The two last mirrors M7, M8 upstream of the wafer can be measured using a measurement beam 136 that is not incident at right angles if a reflector mirror 148 is attached separately from the actual interferometer 134 with the beam shaping unit 138A.

Figure 20:
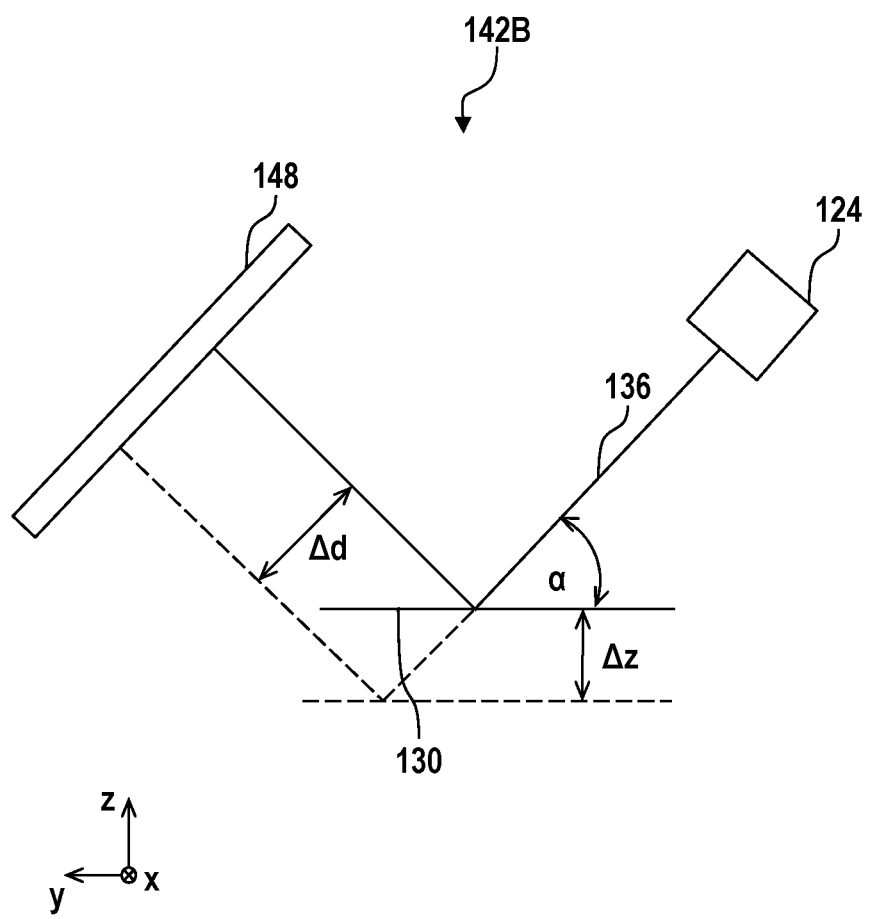
FIG. 20 shows a schematic view of an embodiment of a measuring arrangement.

FIG. 20 shows the incidence of the measurement beam 136 of an interferometer 134 on a used mirror surface 130. As mentioned previously, the interferometer 134 has the function of measuring a path length difference Δd of its measurement beam 136. As shown in FIG. 20, the measured path length difference Δd no longer corresponds to the change Δz in the height profile if the mirror 100 or the used mirror surface 130 is no longer struck at right angles.

In particular, the path length difference Δd as measured by the interferometer 134 changes more significantly than the height profile Δz of the mirror 100. If α is the angle of the measurement beam 136 vis-à-vis the normal (thus α=0° means completely perpendicular incidence, α=90° means completely grazing incidence), then the following applies:

$$\Delta z = \cos\alpha \cdot \Delta d$$

This cosine correction is thus applied to the raw measurement signal prior to the further evaluation.

Figure 21:
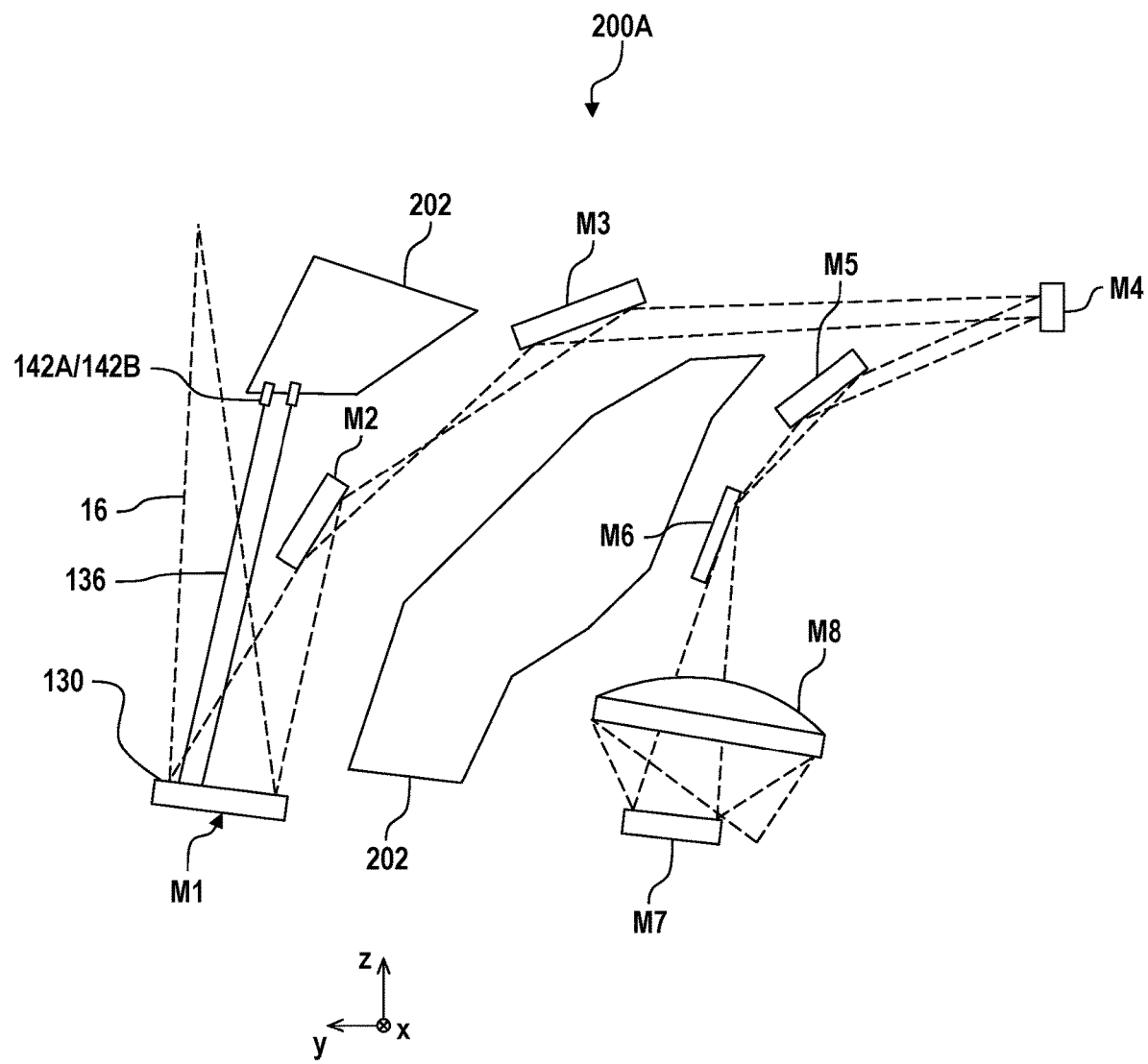
FIG. 21 shows a further schematic view of the optical system according to FIG. 16.

FIG. 21 shows a further view of the optical system 200A. The first mirror M1 can be measured using a perpendicularly incident measurement beam 136. However, this involves that the sensor frame 202 is adapted accordingly, in order to carry one or more measuring arrangements 142A, 142B.

Figure 22:
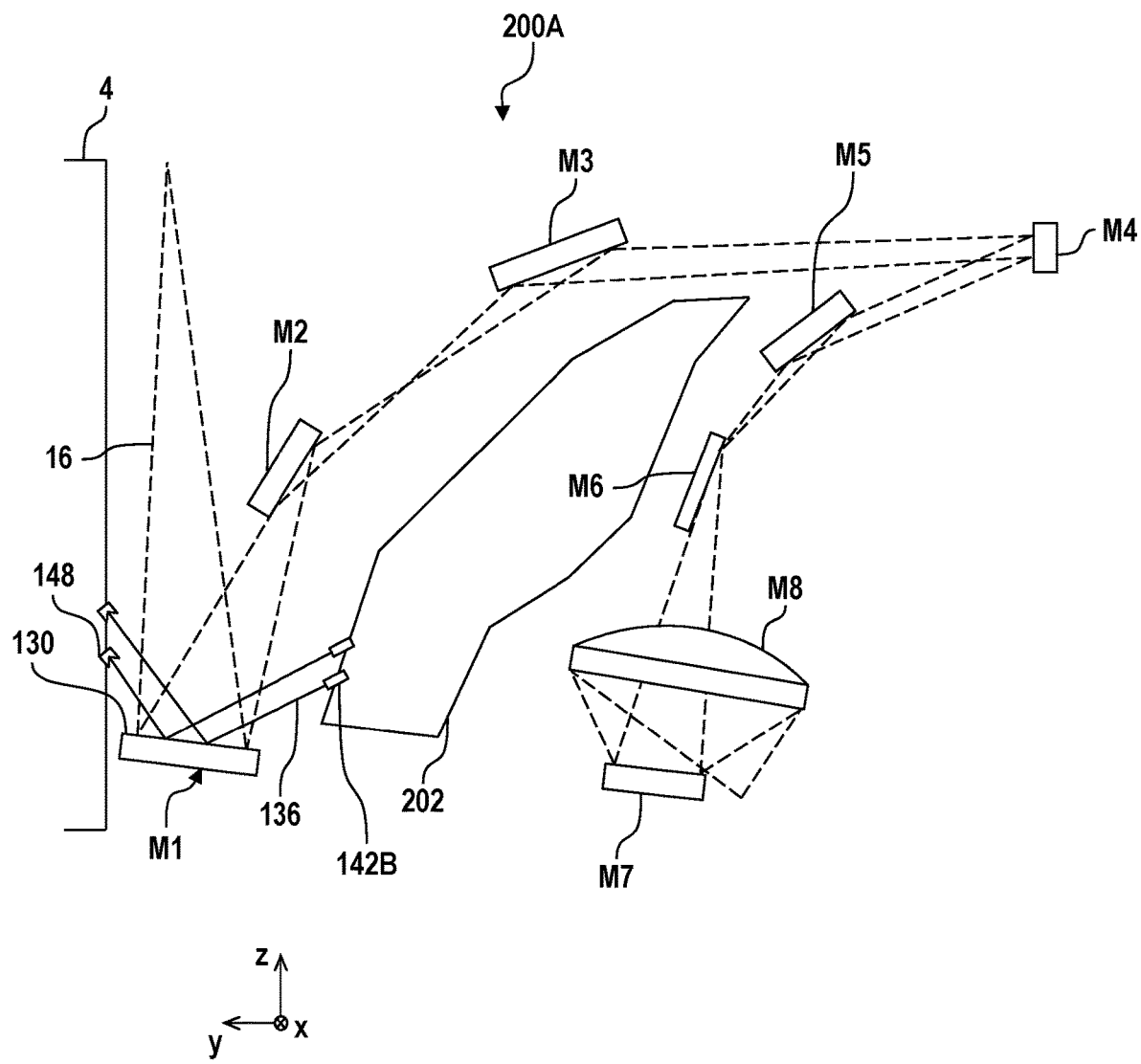
FIG. 22 shows a further schematic view of the optical system according to FIG. 16.

FIG. 22 shows a further view of the optical system 200A. In this case, however, the first mirror M1 is not measured perpendicularly but at an angle. This may however give rise to the conflict that the illumination optical unit 4 is located on the other side and typically another component is immediately arranged there. That is to say that in the case of a non-perpendicular incidence of the measurement beam 136 and an arrangement parallel to the meridional plane, i.e. parallel to an yz-plane, care has to be taken that there are no advances into the installation space of the illumination optical unit 4.

Figure 23:
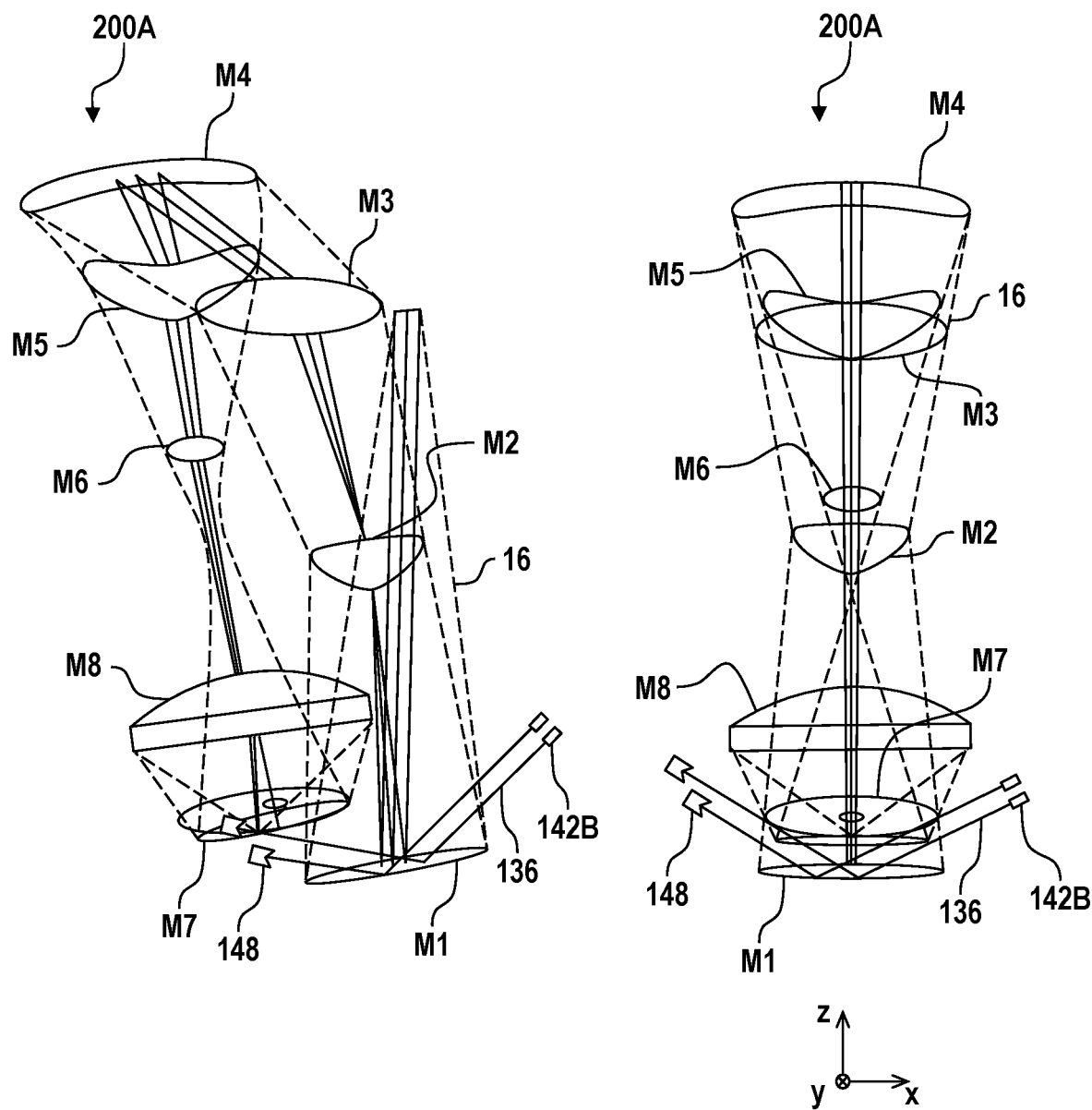
FIG. 23 shows two further schematic views of the optical system according to FIG. 16.

FIG. 23 shows further views of the optical system 200A in two partial figures. To solve the problem explained in relation to FIG. 22, the measurement beam 136 is arranged not in the meridional plane but in a plane twisted in relation thereto. This plane can then be twisted through 90° vis-à-vis the meridional plane.

Figure 24:
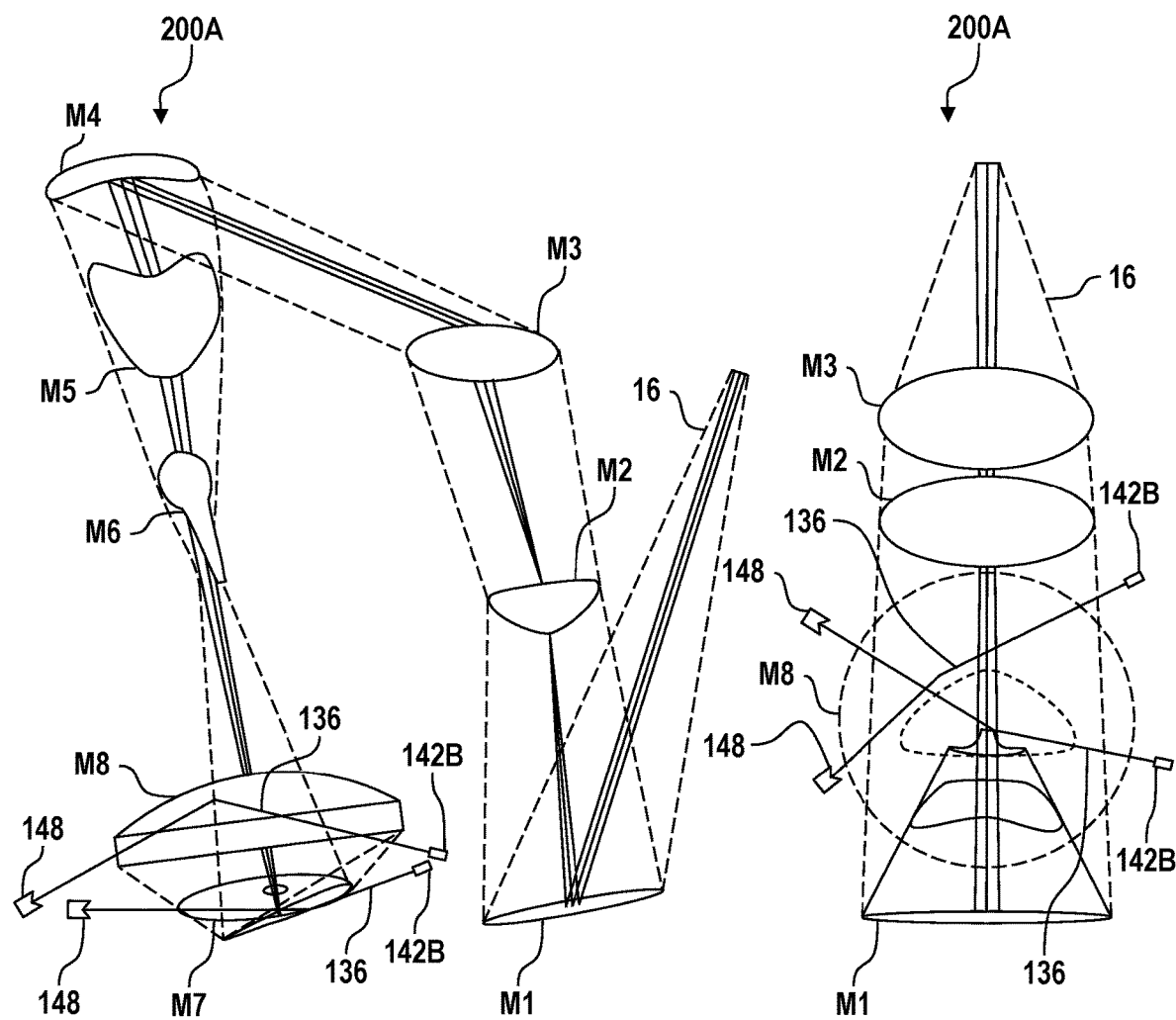
FIG. 24 shows two further schematic views of the optical system according to FIG. 16.

FIG. 24 shows further views of the optical system 200A in two partial figures. The approach explained in relation to FIG. 23 is also possible for the two last mirrors M7, M8. For reasons of installation space, it may be desirable for the measurement beams 136 for the one mirror M7 to not propagate in the same plane as those for the other mirror M8. The two last mirrors M7, M8 can also be measured using measurement beams 136 propagating transversely to the meridional plane.

Figure 25:
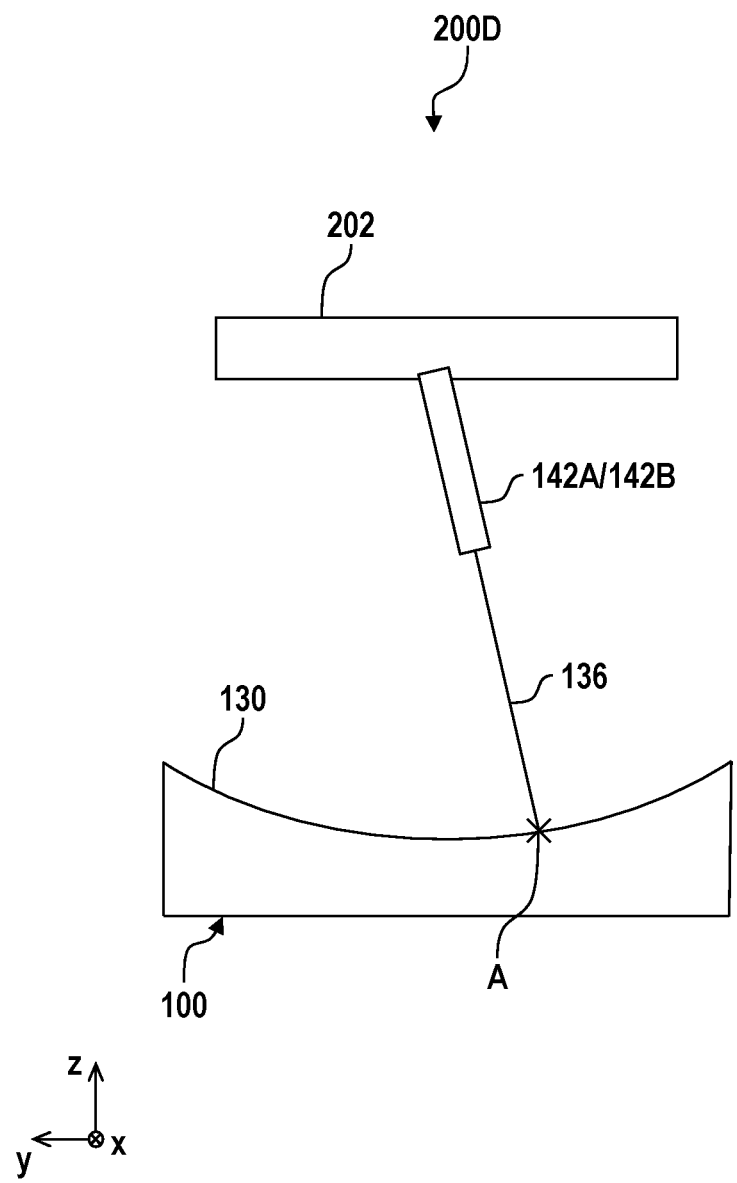
FIG. 25 shows a schematic view of an embodiment of an optical system.
Figure 26:
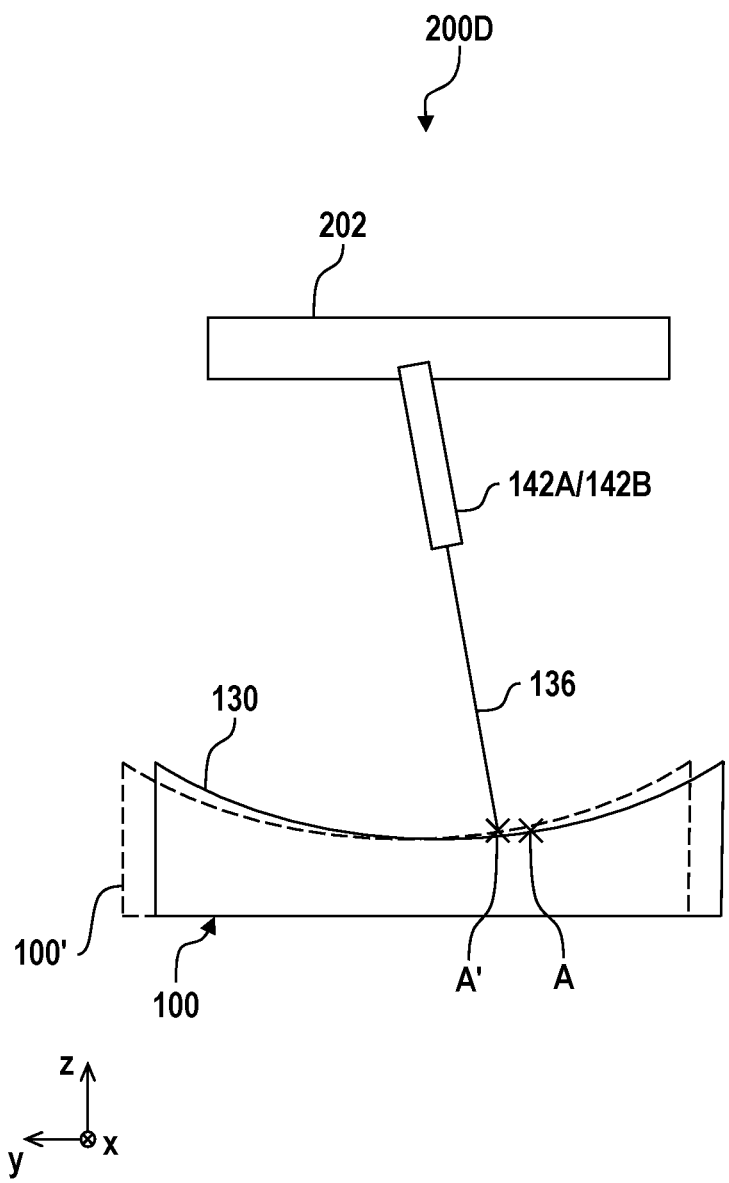
FIG. 26 shows a further schematic view of the optical system according to FIG. 25.

FIG. 25 and FIG. 26 each show an embodiment of an optical system 200D having a measuring arrangement 142A, 142B as explained above. In principle, a distance between a fixed reference, the sensor frame 202 in the present case, and a point A on the mirror 100 is measured with the aid of the measuring arrangement 142A, 142B. In FIG. 26, the measurement beam 136 is depicted as a line. However, as mentioned previously, the measuring arrangement 142A, 142B comprises a suitable beam shaping unit 138A, 138B (not shown) in order to allow the measurement beam 136 to be incident on the used mirror surface 130 at right angles or to focus the measurement beam on the used mirror surface 130.

If there is a lateral displacement of the measurement beam 136 relative to the mirror 100, for example on account of a lateral displacement of the mirror 100, then it is now the distance to a point A' that is measured rather than the distance to the point A (FIG. 26). In FIG. 26, the laterally displaced mirror has been provided with reference sign 100'.

On account of the height profile of the curved used mirror surface 130, there is a difference between the sag at the point A and the sag at the point A'. In other words: even if the actual measurement of the sag were ideal, there nevertheless is a measurement error because the "infinitely accurate" measurement result is assigned to an incorrect location on the mirror 100.

Figure 27:
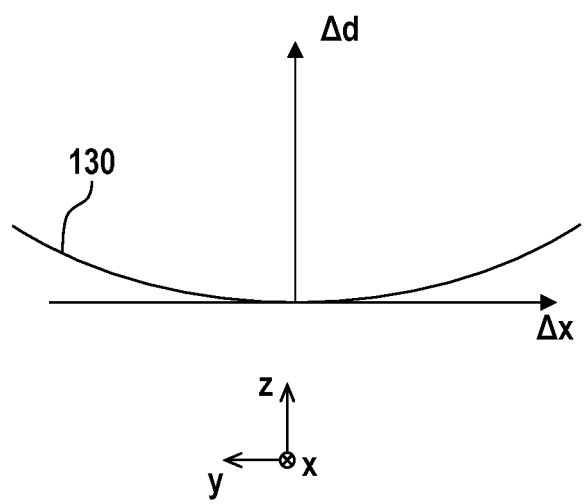
FIG. 27 shows a schematic view of an embodiment of a curved used mirror surface.

FIG. 27 shows the used mirror surface 130 of the mirror 100. Locally, the mirror 100 can always be described as a tilted ellipsoid or equivalently as an off-centered ellipsoid. According to design, the measurement beam 136 is incident perpendicularly on point A or point A', and so the used mirror surface 130 can be described locally as a non-tilted ellipsoid in this coordinate system. Thus, the used mirror surface 130 can be described as a sphere in one direction. This allows the aforementioned sag error on account of the lateral offset to be estimated.

The curvature is direction-dependent in the case of an ellipsoid. Let ρ be the local curvature along the direction A-A', then the sag profile Δd (in this coordinate system) emerges as:

$$\Delta d = \frac{\rho}{2}\Delta x^2$$

In this case, Δx represents the distance of the observed point A on the used mirror surface 130 from the origin in the local coordinate system. This sag profile also directly specifies the measurement error. The measured distance difference Δd likewise arises from the distance Δx between the two points A and A' and the local curvature ρ of the mirror as:

$$\Delta d = \frac{\rho}{2}\Delta x^2$$

A maximum permissible lateral displacement of the measurement beam 136 of 5 μm would arise in the case of a permitted measurement error of Δd=10 pm and typical radii of curvature of 1 meter. Wishing to achieve this is fatuous, especially since a typical measurement beam 136 of an interferometer 134 used in EUV systems already has an inherent diameter of approximately 1 mm or even 6 mm.

In summary, it is consequently possible to state that irrespective of how exactly the measuring arrangement 142A, 142B as such can measure, the measurement error will always be much greater than the required measurement accuracy on account of the fact that the actual point A, A' measured on the mirror 100 is unknown.

This aforementioned problem can be solved by virtue of using not the measured absolute distance signal d(t) directly but only the temporal change Δd(t) in the measured distance signal d(t). For example, a first distance is measured at a time $t_1$, a second distance is measured at a time $t_2$ and a third distance is measured at a time $t_3$. Then, the change in the distance between $t_1$ and $t_2$ and between $t_1$ and $t_3$ is considered. In an alternative, the temporal change in the distance may also be determined directly by a suitable measuring and evaluation apparatus, without having to resort to discrete measurement times.

This consideration of the temporal change Δd(t) in the measured distance signal d(t) is sufficient because knowing the amplitude $A_k$ of each mode and the corresponding phase $\Phi_k$ is sufficient for the desired closed-loop control purpose, specifically the suppression of the vibration of N eigenmodes, where k=1, ..., N. By contrast, the absolute distance to a specific point A on the used mirror surface 130 and/or the absolute shape of the used mirror surface 130 are irrelevant.

Let z(x, y) be the true static height profile of the used mirror surface 130, i.e. the height profile of the used mirror surface 130 which sets-in in the absence of external excitations. Let Δz(x, y, t) be the change in the height profile of the used mirror surface 130 on account of excited vibrations. If $\Psi_k(x, y)$ denotes the shape of the k-th eigenmode, then the following arises as the progression of the height profile over time:

$$\Delta z(x, y, t) = \sum_{k=1}^{N} \Delta z_k(x, y, t) = \sum_{k=1}^{N} A_k \Psi_k(x, y) \sin(\omega_k t + \phi_k)$$

The j-th interferometer 134 measures the absolute distance $d_j(t)$ from the point $(x_j, y_j)$ on the mirror 100 or on the used mirror surface 130. If $\Delta d_j(t)$ is its temporal change relative to its mean value, then $\Delta z(x_j, y_j, t) = \Delta d_j(t)$ applies, whereby the contact with the formula above is given:

$$\Delta d_j(t) = \sum_{k=1}^{N} A_k \Psi_k(x_j, y_j) \sin(\omega_k t + \phi_k)$$

It was recognized that the eigenfrequencies ωk are all very much larger than (almost) all other effects that can influence the distance measurement, for example interferometer calibration variations and in particular the lateral drift of the measurement beam 136 relative to the mirror 100, which is already shown in FIG. 26. The formula above is therefore not influenced by these effects.

The eigenfrequencies $\omega_k$ are known very accurately, for example from a virtual mechanical model of the mirror 100, in particular from a CAD system. This can be exploited to extract the information relating to an individual mode from the measurement signal $\Delta d_j(t)$. In principle, this extraction can be achieved via an electronic bandpass filter.

Since the relevant eigenfrequencies are of the order of 100 Hz and therefore very small on electronic scales, it tends to be desirable in practice to realize the evaluation via a computer unit, especially in the form of a computer. Filtering in the frequency domain can easily be implemented on a computer unit via a Fourier transform. The Fourier transform $F(\omega)$ of a temporal function $f(t)$ is as follows:

$$F(\omega) = \frac{1}{\sqrt{2\pi}} \int_{-\infty}^{\infty} e^{i\omega t} f(t) dt, \quad f(t) = \frac{1}{\sqrt{2\pi}} \int_{-\infty}^{\infty} e^{-i\omega t} F(\omega) d\omega$$

There are different definitions for the Fourier transform, which differ in the manner in which the pre-factor ½π is distributed among the transform and inverse transform. In the definition used in the formula above, this factor is distributed symmetrically among the transform and inverse transform. A bandpass filter can be realized by a sequence of Fourier transform, masking of all frequency components outside of a frequency interval and inverse transform.

However, the Fourier transform can be used not only for bandpass filtering but also for directly determining the relative amplitudes $A_k$ and phases $\Phi_k$ since the time representation $$\Delta d_j(t) = \sum_{k=1}^{N} A_k \Psi_k(x_j, y_j) \sin(\omega_k t + \phi_k)$$

directly gives rise to the frequency representation $$\Delta D_j(\omega) = \sum_{k=1}^{N} \sqrt{2/\pi} A_k \Psi_k(x_j, y_j) \left[ e^{i\phi_k} \delta(\omega + \phi_k) + e^{-i\phi_k} \delta(\omega - \phi_k) \right] \quad (1)$$

and so $A_k$ and $\Phi_k$ can be read directly from the value of $\Delta D_j(\omega_k)$.

At this point, explicit reference is made once again to the fact that it is not only the amplitude $A_k$ but also the phase $\Phi_k$ that is determined. However, in principle it is sufficient to know only the phase $\Phi_k$, to be precise with a permissible error of ±π/2. In principle, it is fundamentally possible to only have available information as to whether it is desirable to "press" or simply "push" for damping purposes at a specific time. For this, the mentioned phase information is sufficient. However, such a closed-loop control approach only works in principle since the control bandwidth would have to be extremely high. The more accurately the amplitude $A_k$ and phase $\Phi_k$ are able to be determined, the more relaxed the demands on the closed-loop control become.

An infinitely exact measurement and an infinitely exact evaluation would yield the true values for $A_k$ and $\Phi_k$. However, this is not the case in reality and each of the M measuring arrangements 142A, 142B, where j=1, ..., M, will supply N slightly different amplitudes $A_k^j$ and N phases $\Phi_k^j$ according to the evaluation just described. Naturally, the phase $\Phi_k$ is undetermined if the corresponding amplitude $A_k$ vanishes.

It is purely for compositional reasons that an uppercase "Phi" is used in the running text while the formulae use a lowercase "phi". However, these two symbols should be considered to be identical.

Without measurement error, all M measured phases $\Phi_k^j$ of the k-th mode would be identical, and to be precise equal to the true phase $\Phi_k$:

$$\phi_k^j = \phi_k \forall j = 1, \ldots, M$$

Without a measurement error, the M measured amplitudes $A_k^j$ would arise from the true amplitude $A_k$ and the mode profile $\Psi_k$:

$$A_k^j = \Psi_k(x_j, y_j) A_k$$

or, conversely, the same true amplitude $A_k$ would arise from each individual measurement value $A_k^j$. Therefore, estimates for $\Phi_k$ and $A_k$ is determined from the measured values of $\Phi_k^j$ and $A_k^j$. Such fitting methods are standard tasks for which there are standard algorithms. These algorithms can be formulated more compactly in complex notation:

$$c = A \cdot e^{i\phi}$$

In the simplest case, the estimate for the complex amplitude $c_k$ of the k-th eigenmode is as follows:

$$c_k = \frac{1}{M} \sum_{j=1}^{M} \frac{c_k^j}{\Psi_k(x_j, y_j)}$$

However, this approach is suboptimal. If $\Psi_k(x_j, y_j)$ is small at a location $(x_j, y_j)$ then the amplitude $A_k$ measured there is also small, and so two small numbers are divided by one another in the equation above. This makes the calculation very sensitive to measurement errors. It may be more desirable to weight each measurement value with $\Psi_k(x_j, y_j)$. This results in:

$$c_k = \frac{\sum_{k=1}^{M} c_k^j}{\sum_{k=1}^{M} \Psi_k(x_j, y_j)} \quad (2)$$

Figure 28:
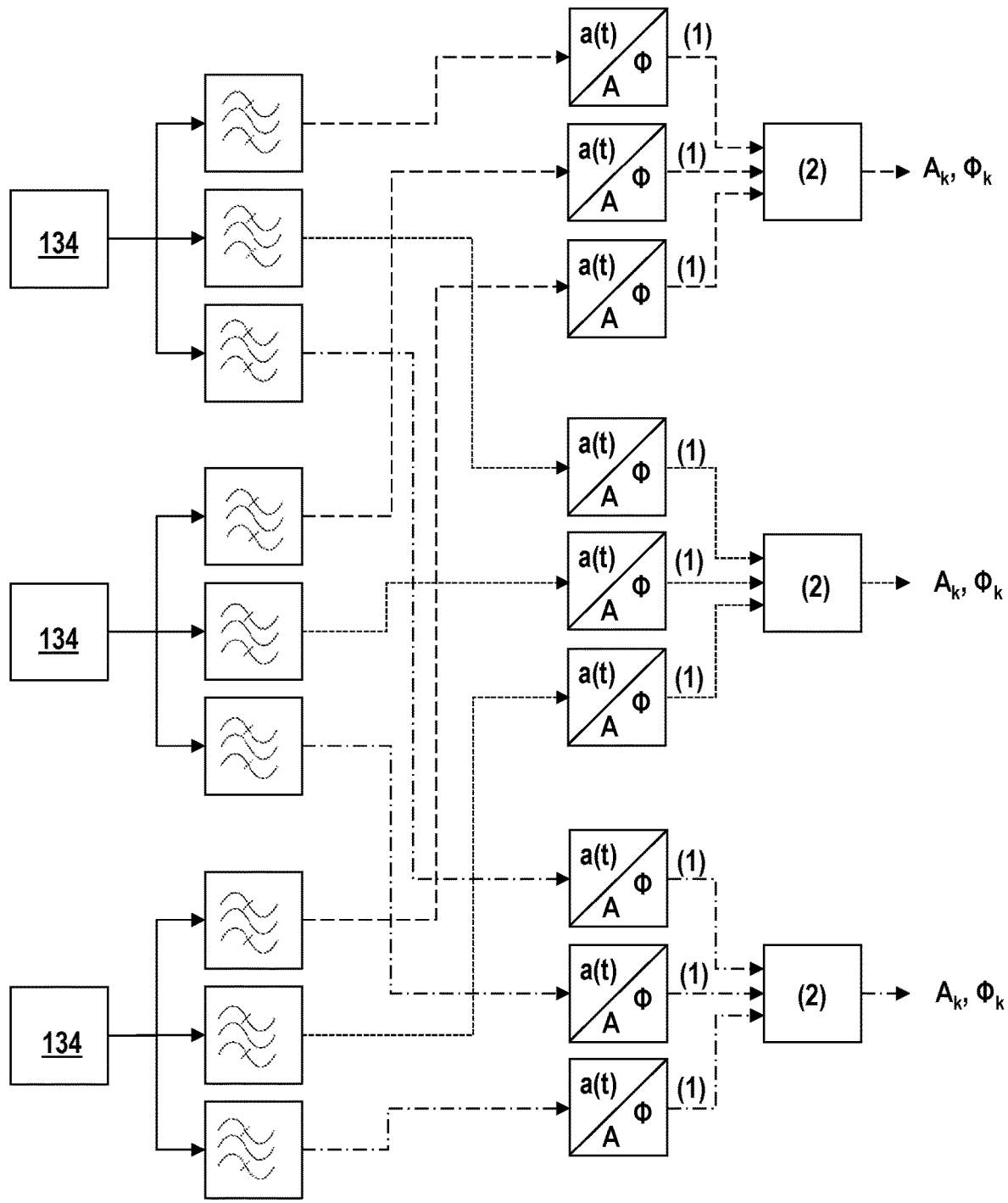
FIG. 28 shows a schematic flowchart of an embodiment of a procedure for ascertaining mirror vibrations.

FIG. 28 shows the previously described procedure with explicit bandpass filters in a type of flowchart. The measurement result from each measuring arrangement 142A, 142B or each interferometer 134 is split by bandpass filters into partial signals each containing only the contribution of one eigenmode. The signals are the temporal progression of a distance signal. From these signals, it is then possible to determine an amplitude $A_k$ and a phase $\Phi_k$ in each case. Therefore there are different specific ascertained amplitudes $A_k$ and phases $\Phi_k$ for each eigenmode, specifically one value pair per interferometer 134 for example. These are then fitted to form a single value pair of amplitude $A_k$ and phase $\Phi_k$.

FIG. 28 shows the flowchart for the case of three measuring arrangements 142A, 142B or three interferometers 134 and three excitable eigenmodes. The solid lines specify the data flow containing information for all eigenmodes while the three lines represented differently (dashed, dotted, dash-dotted) denote the data flow for the three different eigenmodes. The number of the equation realizing the corresponding functionality is specified on a few boxes.

This data flow is based on the fact that the information of an eigenmode can be extracted via a bandpass filter, i.e. the information of an eigenmode can be differentiated from that of other modes on account of the frequency. This is no longer the case if two eigenmodes are degenerate, i.e. have the same frequency. In this case, the (at least) two degenerate eigenmodes can only be distinguished by virtue of considering the time profile at a plurality of locations. To simplify notation, the assumption is made that modes 1 and 2 are degenerate. They both have the same eigenfrequency $\omega$. Following filtering in the bandpass filter at the frequency $\omega$, the filtered measurement signal from the M interferometers 134 has the following time profile:

$$\Delta z_\omega(x_j, y_j, t) = A_1\Psi_1(x_j, y_j)\sin(\omega t + \phi_1) + A_2\Psi_2(x_j, y_j)\sin(\omega t + \phi_2)$$

This can be written more compactly as follows:

$$\Delta z_\omega^j(t) = A_1\Psi_1^j\sin(\omega t + \phi_1) + A_2\Psi_2^j\sin(\omega t + \phi_2)$$

The sum of trigonometric functions of identical frequency, even with different phases $\Phi_k$ and/or amplitudes $A_k$, in turn yields a single trigonometric function, and so this can be written as:

$$A_\omega^j\sin(\omega t + \phi_\omega^j) = A_1\vec{\Psi}_1^j\sin(\omega t + \phi_1) + A_2\vec{\Psi}_2^j\sin(\omega t + \phi_2)$$

Or this can be written as a vector containing the information from all measurement locations:

$$\vec{A}_\omega\sin(\omega t + \vec{\phi}_\omega) = A_1\vec{\Psi}_1\sin(\omega t + \phi_1) + A_2\vec{\Psi}_2\sin(\omega t + \phi_2)$$

$A_\omega$ and $\Phi_\omega$ are measured quantities, for example by way of a Fourier analysis of the bandpass-filtered signal at the various locations, $\omega$, $\Psi_1$ and $\Psi_2$ are known, and $A_1$, $A_2$, $\Phi_1$ and $\Phi_2$ are sought.

The solution to this equation is often also referred to as principal component analysis (PCA) of oscillatory processes, with the term principal component analysis however being very broad and being used in many different contexts. In particular, the term principal component analysis is even used when the eigenfrequencies are not known and have to be determined from the measurement signals.

However, the basic idea for the solution of the equation above can be identified very easily if there is a transition to complex notation:

$$\vec{c}_\omega e^{i\omega t} = c_1\vec{\Psi}_1 e^{i\omega t} + c_2\vec{\Psi}_2 e^{i\omega t}$$

Hence, the task is that of simply determining two complex numbers $c_1$ and $c_2$, given known $\Psi_1$ and $\Psi_2$, from a measured vector $c_\omega$ of complex numbers:

$$\vec{c}_\omega = c_1\vec{\Psi}_1 + c_2\vec{\Psi}_2$$

This is trivially solvable provided the number of degenerate modes and measurement values, i.e. the dimensions of the vectors in the equation, are identical. The number of measurement values is typically significantly larger than the number of degenerate eigenmodes. Nevertheless, the equation would be trivially solvable in the absence of measurement errors. In reality, a fit for $c_1$ and $c_2$ is found. For example, this can be implemented via a least square fit, i.e. there is a search for values of $c_1$ and $c_2$ such that the deviation becomes minimal:

$$\left\| \vec{c}_\omega - c_1\vec{\Psi}_1 + c_2\vec{\Psi}_2 \right\| \to \text{minimal}$$

Although the "c" are complex, the coefficients "$\Psi$" are real, and so it is possible to use the normal formulae for a least square fit. If the following abbreviations are introduced:

$$X_{jk} = \Psi_k(x_j, y_j), \vec{c} = (c_1, c_2, \ldots)$$

then the following arises as a solution to the fitting problem:

$$\vec{c} = (X^T X)^{-1} X^T \vec{c}_\omega \quad (3)$$

Figure 29:
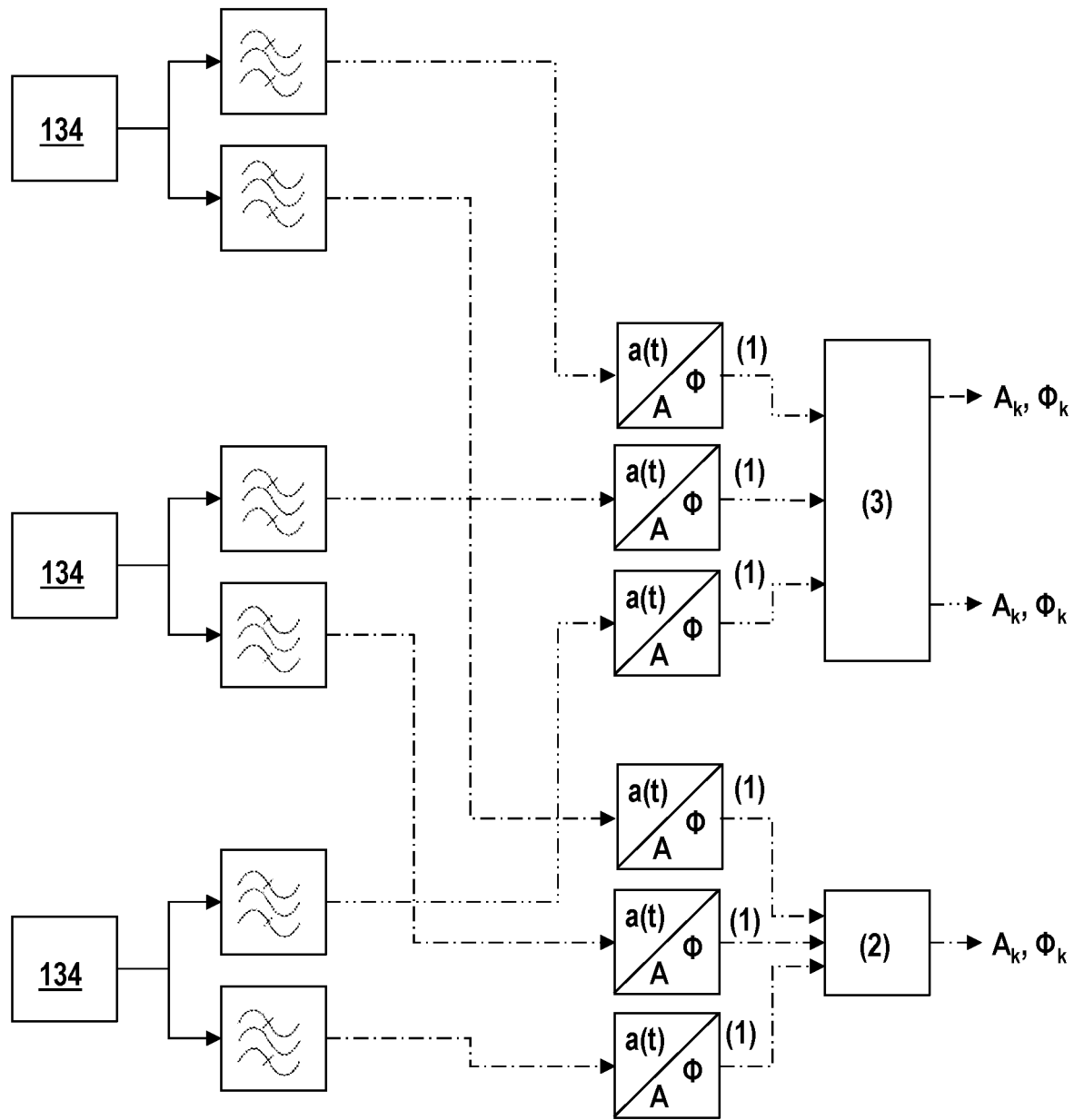
FIG. 29 shows a schematic flowchart of an embodiment of a procedure for ascertaining mirror vibrations.

The above-described evaluation method, i.e. the joint determination of the amplitudes and phases of degenerate eigenmodes, is depicted graphically in FIG. 29. In this case, the numbers of the corresponding mathematical equations are specified in the two functional blocks in the right part of FIG. 29.

If two eigenmodes are degenerate, i.e. have the same eigenfrequency, then they can no longer be separated via a bandpass filter, which is to say it is not possible to extract information about exactly one eigenmode from a time profile of a distance signal. The separation of the measurement information into individual eigenmodes can only be implemented by virtue of considering the time profiles of the distance signal at different measurement locations, i.e. the measurement signals from different interferometers 134, together.

In the above-described approach, the amplitudes $A_k$ and phases $\Phi_k$ of all degenerate eigenmodes are determined simultaneously (in the illustrated mathematical model by solving a single joint system of equations). Each eigenmode can be considered separately under certain boundary conditions. This is because degenerate eigenmodes are orthonormal to one another:

$$\int\int \Psi_k(x, y)\Psi_l(x, y)dxdy = \delta_{kl}$$

If the M measurement positions of the interferometers 134 are chosen skillfully, specifically such that $$\sum_{j=1}^{M} \Psi_k(x_j, y_j)\Psi_l(x_j, y_j) = 0 \text{ if } k \neq l$$

applies, i.e. the eigenmodes are also orthonormal on the discrete measurement grid, then the evaluation is simplified. This is no requirement with respect to the eigenmodes, i.e. no requirement with respect to the shape of the mirror 100, but a desired property with respect to the choice of measurement positions. Suitable measurement positions can be found for any desired shape of the mirror 100 and hence for any desired eigenmodes. Under certain circumstances, orthogonality can also be attained by virtue of including only some of the measurement positions in the evaluation.

The already shown equation:

$$\vec{c_\omega} = c_1\vec{\Psi_1} + c_2\vec{\Psi_2} \text{ or } |c_w\rangle = c_1|\Psi_1\rangle + c_2|\Psi_2\rangle$$

can be rewritten by multiplication by the appropriate bra as $$\langle\Psi_1|c_\omega\rangle = c_1\langle\Psi_1|\Psi_1\rangle + c_2\langle\Psi_1|\Psi_2\rangle = c_1\langle\Psi_1|\Psi_1\rangle$$

and hence the following arises:

$$c_1 = \frac{\sum_{j=1}^{M} \Psi_1(x_j, y_j)c_\omega^j}{\sum_{j=1}^{M} \Psi_1(x_j, y_j)^2} \quad (4)$$

Figure 30:
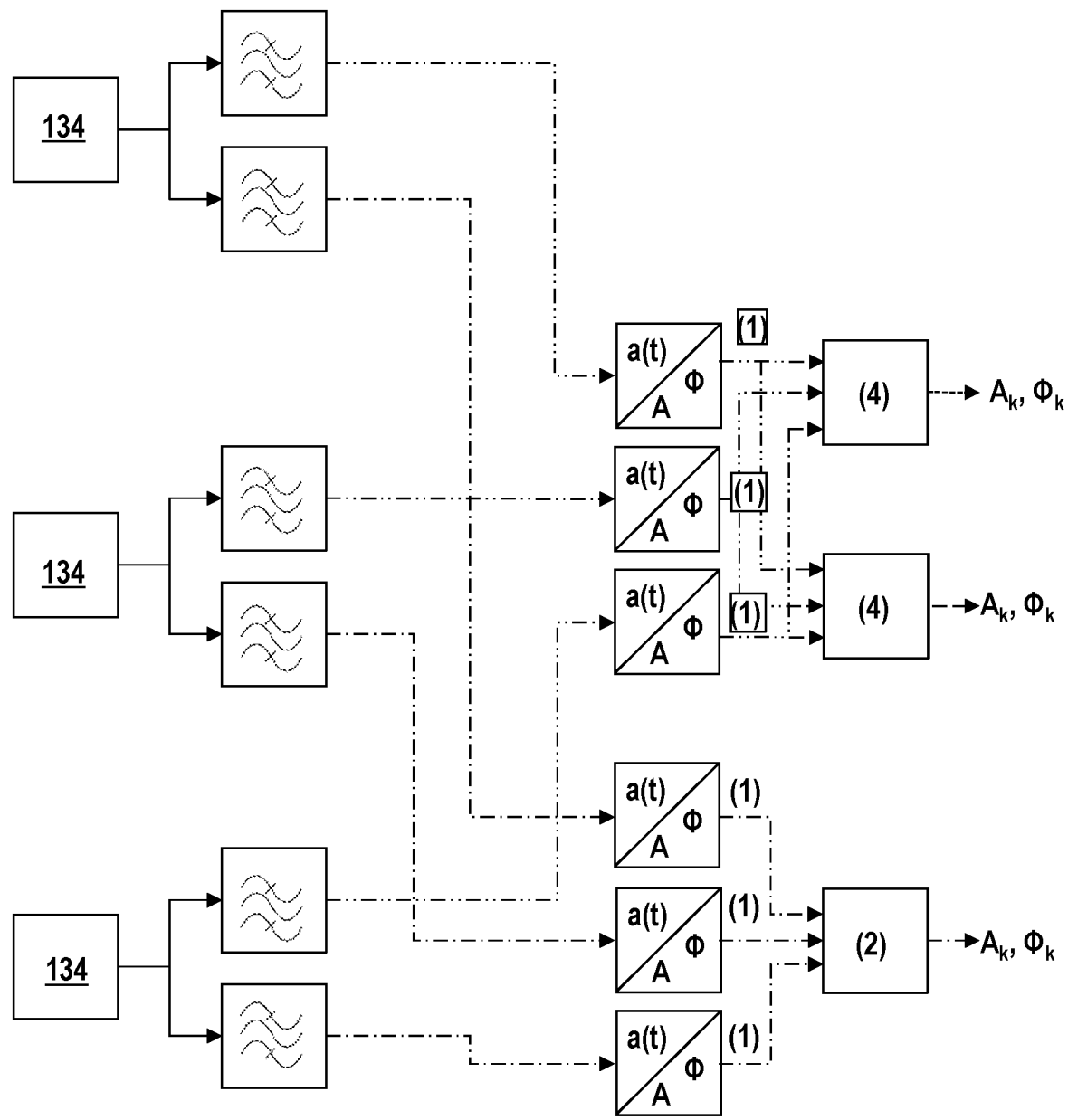
FIG. 30 shows a schematic flowchart of an embodiment of a procedure for ascertaining mirror vibrations.

This means that the amplitude $A_k$ and phase $\Phi_k$ of an eigenmode can be calculated on the basis of a measurement and knowledge about the mode profile of the eigenmode, without further knowledge about the other degenerate eigenmodes being available. This is shown here for precisely two degenerate eigenmodes but also applies to more than two degenerate eigenmodes for as long as these eigenmodes are orthogonal on the measurement grid. Accordingly, a data flow as shown in FIG. 30 is also possible.

Provided the measurement positions are chosen such that the degenerate eigenmodes are orthogonal thereon, the amplitude $A_k$ and phase $\Phi_k$ can be determined separately for each eigenmode.

Figure 31:
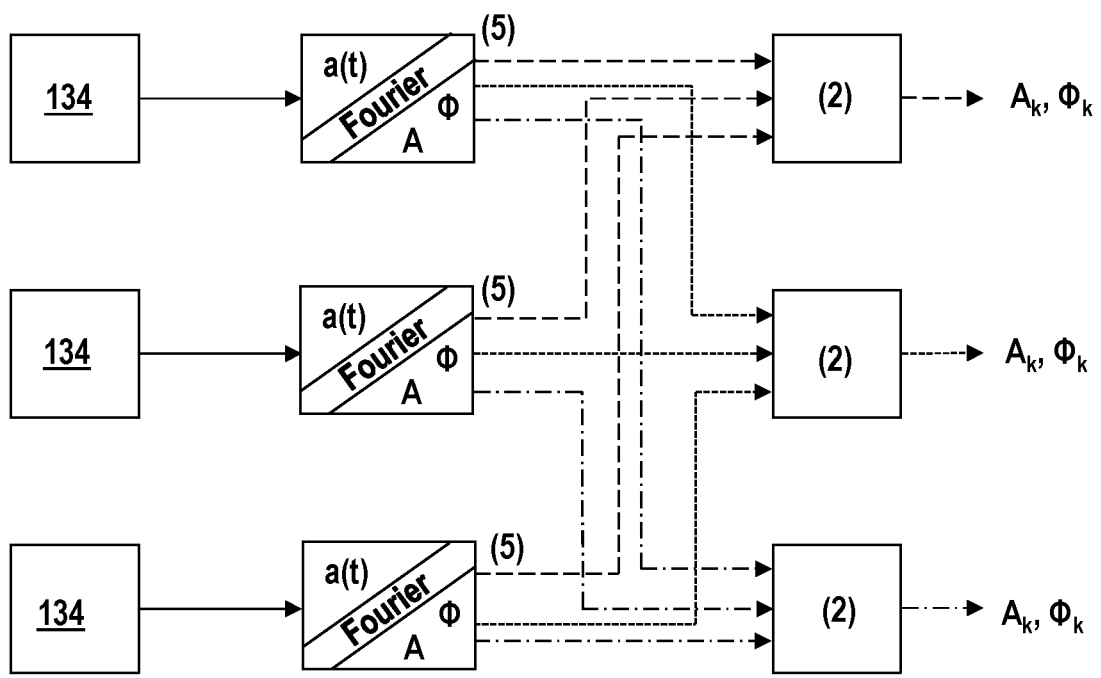
FIG. 31 shows a schematic flowchart of an embodiment of a procedure for ascertaining mirror vibrations.

As already shown, the amplitudes $A_k$ and phases $\Phi_k$ may also be determined directly from a Fourier transform, i.e. explicit bandpass filtering is not necessary. This is because (in the non-degenerate case) the Fourier transform $\Delta D_j(\omega)$ of the distance signal $\Delta d_j(\omega)$ already shown in equation (1)

$$\Delta D_j(\omega) = \sum_{k=1}^{N} \sqrt{2/\pi} A_k \Psi_k(x_j, y_j) [e^{i\phi_k}\delta(\omega + \phi_k) + e^{-i\phi_k}\delta(\omega - \phi_k)] \quad (5)$$

directly yields all amplitudes $A_k$ and phases $\Phi_k$ by virtue of simply "looking" at different frequencies in the Fourier transform. Hence, the data flow from FIG. 31 arises in the non-degenerate case. Explicit bandpass filters can be dispensed with if a Fourier transform is used to determine the amplitudes $A_k$ and phases $\Phi_k$.

Figure 32:
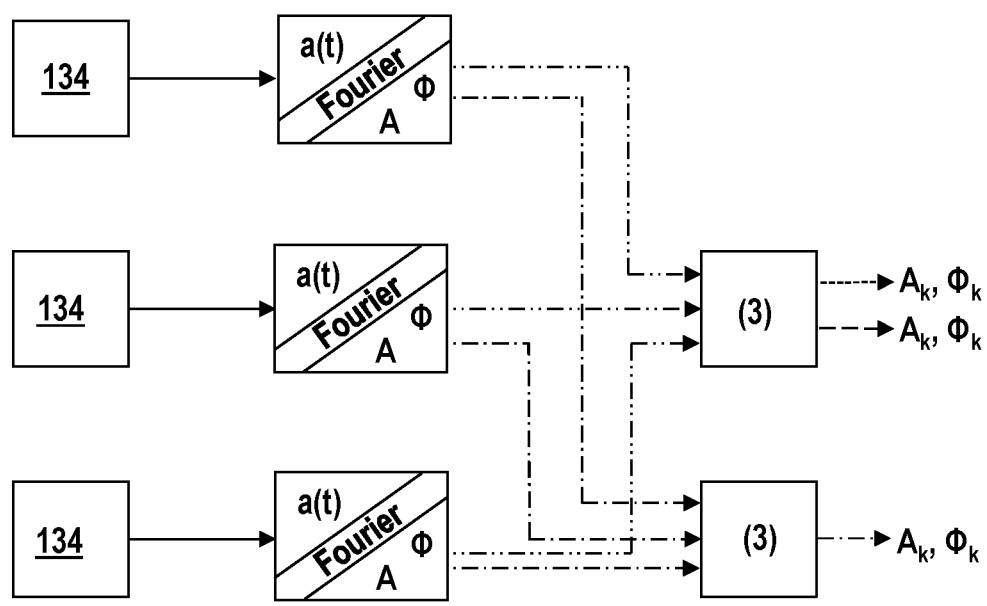
FIG. 32 shows a schematic flowchart of an embodiment of a procedure for ascertaining mirror vibrations.

The modifications in the case of degenerate eigenmodes are completely analogous to what was treated previously. Thus, the data flow from FIG. 32 arises in the general case, i.e. for any desired choice of the measurement positions.

Figure 33:
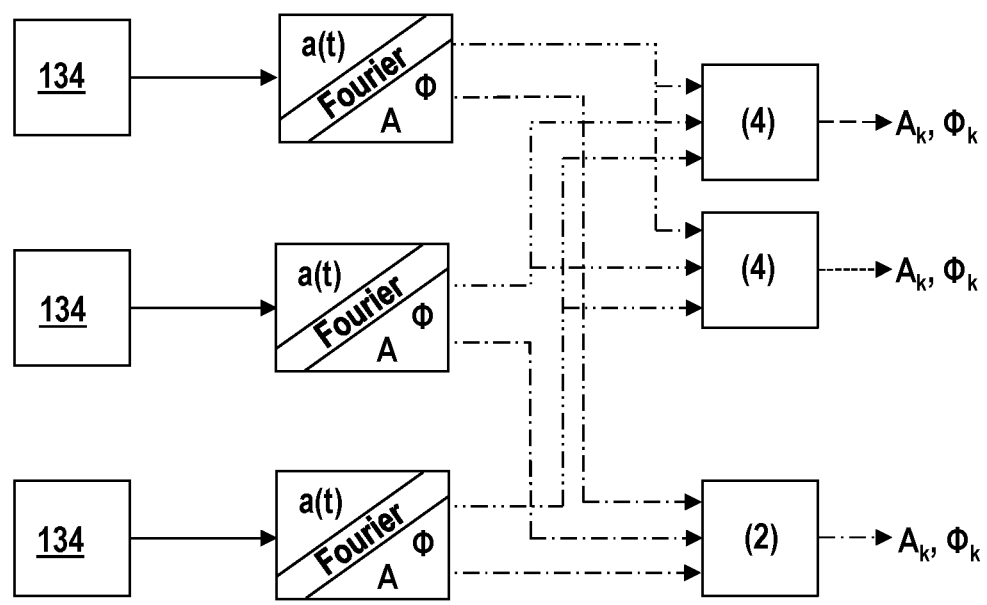
FIG. 33 shows a schematic flowchart of an embodiment of a procedure for ascertaining mirror vibrations.

What can be achieved by a suitable choice of measurement positions is that the eigenmodes are also orthogonal on the measurement grid, with the result that a separate evaluation of the individual modes is possible. This is depicted in FIG. 33.

Figure 34:
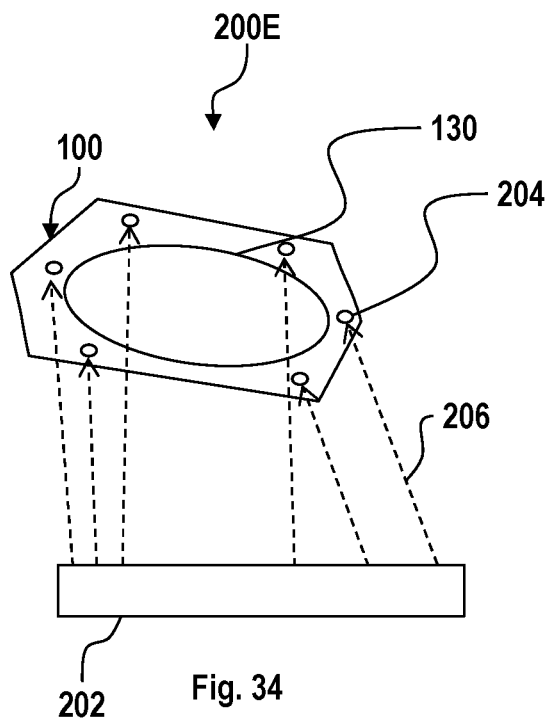
FIG. 34 shows a schematic view of an embodiment of an optical system.
Figure 35:
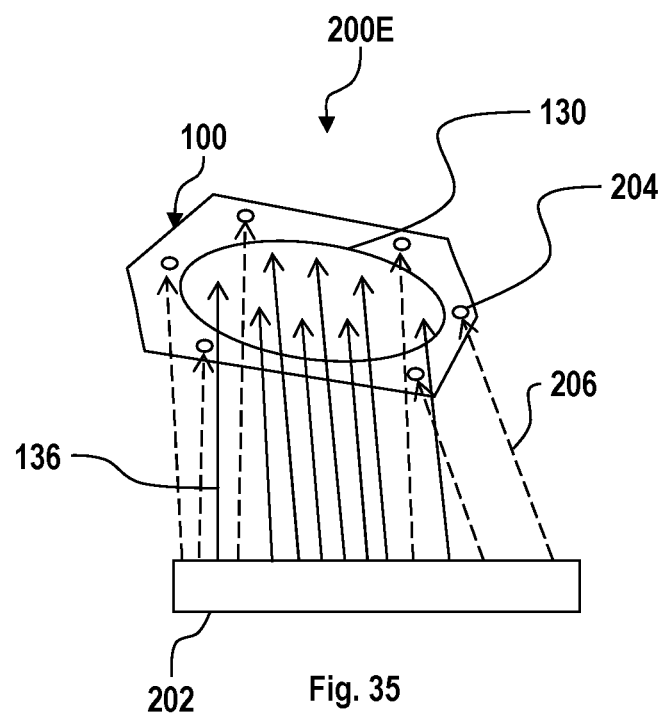
FIG. 35 shows a further schematic view of the optical system according to FIG. 34.
Figure 36:
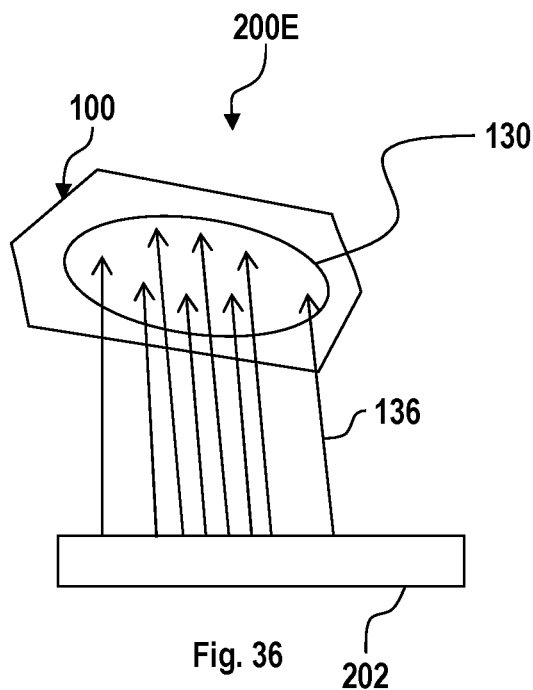
FIG. 36 shows a further schematic view of the optical system according to FIG. 34.

FIG. 34 to FIG. 36 each show schematic views of an embodiment of an optical system 200F. The optical system 200F comprises a mirror 100 as mentioned above having a used mirror surface 130 and a sensor frame 202. Targets 204, in particular interferometer targets, are attached to the mirror 100. The targets 204 can be mirrors. The targets 204 can be attached to the mirror 100 on the back side or front side. However, the targets 204 are placed outside of the used mirror surface 130.

Six interferometers (not shown) are used per mirror 100 in order to be able to control the six rigid body degrees of freedom. The targets 204 are measured with the aid of measurement beams 206, depicted using dashed lines in FIGS. 34 and 35.

These interferometers are highly accurate as they are able to measure large changes in the distance. In this case, "large" means a few micrometers, whereas the above-described measuring arrangement 142A, 142B can handle amplitudes of several dozen picometers. These interferometers for closed-loop control of the rigid body degrees of freedom are therefore much more complicated than the additional interferometers 134 for measuring the used mirror surface 130.

As shown in FIG. 35, the additional interferometers 134 use their measurement beams 136, which are depicted using solid lines in FIGS. 35 and 36, to measure points on the used mirror surface 130. The actual interferometers 134 are not shown in FIGS. 35 and 36. These interferometers 134 can be less accurate than the interferometers for measuring the targets 204 because they only are able to measure relative movements that have a relatively high frequency. In particular, drift effects are inconsequential.

In principle, it is possible to dispense with the interferometers for measuring the targets 204, as indicated in FIG.

36, since the measuring arrangements 142A, 142B with the interferometers 134 are able to supply the same information. This applies for as long as at least six interferometers 134 or measuring arrangements 142A, 142B are provided. For example, if only four measuring arrangements 142A, 142B or four interferometers 134 are provided, then two further interferometers measuring the targets 204 would have to be present in order to be able to measure the six rigid body degrees of freedom.

The relevant information for measuring the rigid body degrees of freedom is found in the "zero frequency component" of the measurement signal or in the component with a small frequency, for example less than 10 Hz. This "zero frequency component" can then be used directly as an input for closed-loop control of the rigid body degrees of freedom.

However, this involves the interferometers 134 to meet the desired accuracy of the interferometers for measuring the targets 204 even though it is more difficult for them to attain these desired accuracy properties, for example because they cannot use the targets 204 that are optimized for the desired accuracy properties but makes do with the curved used mirror surface 130 of the mirror 100.

Figure 37:
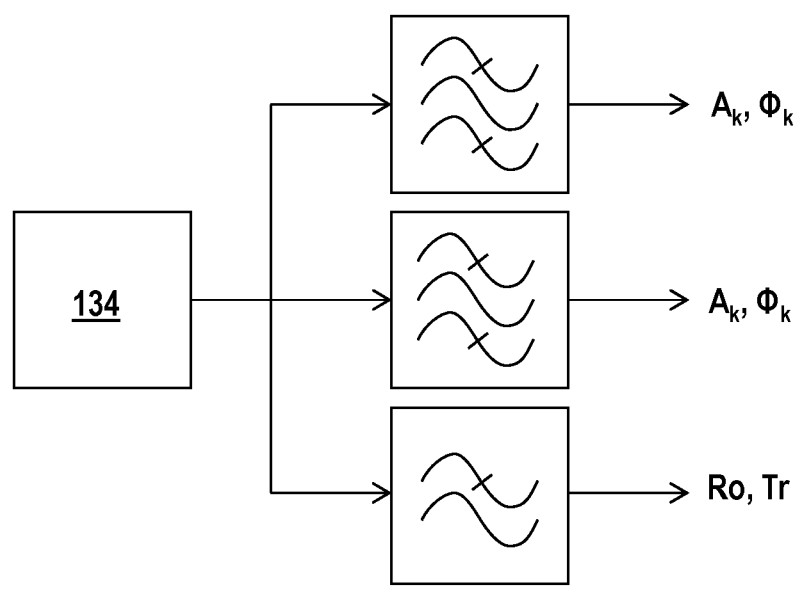
FIG. 37 shows a schematic flowchart of an embodiment of a procedure for ascertaining mirror vibrations.

FIG. 37 shows the evaluation of the measurement results as already mentioned previously, in a flowchart. In FIG. 37, the "rotation" rigid body degree of freedom is denoted Ro. The "translation" rigid body degree of freedom is denoted Tr. For example, two bandpass filters and a low-pass filter are used in the evaluation of the measurement results, with the low-pass filter being provided to extract the "zero frequency component", i.e. to extract the translation Tr and rotation Ro rigid body degrees of freedom.

Figure 38:
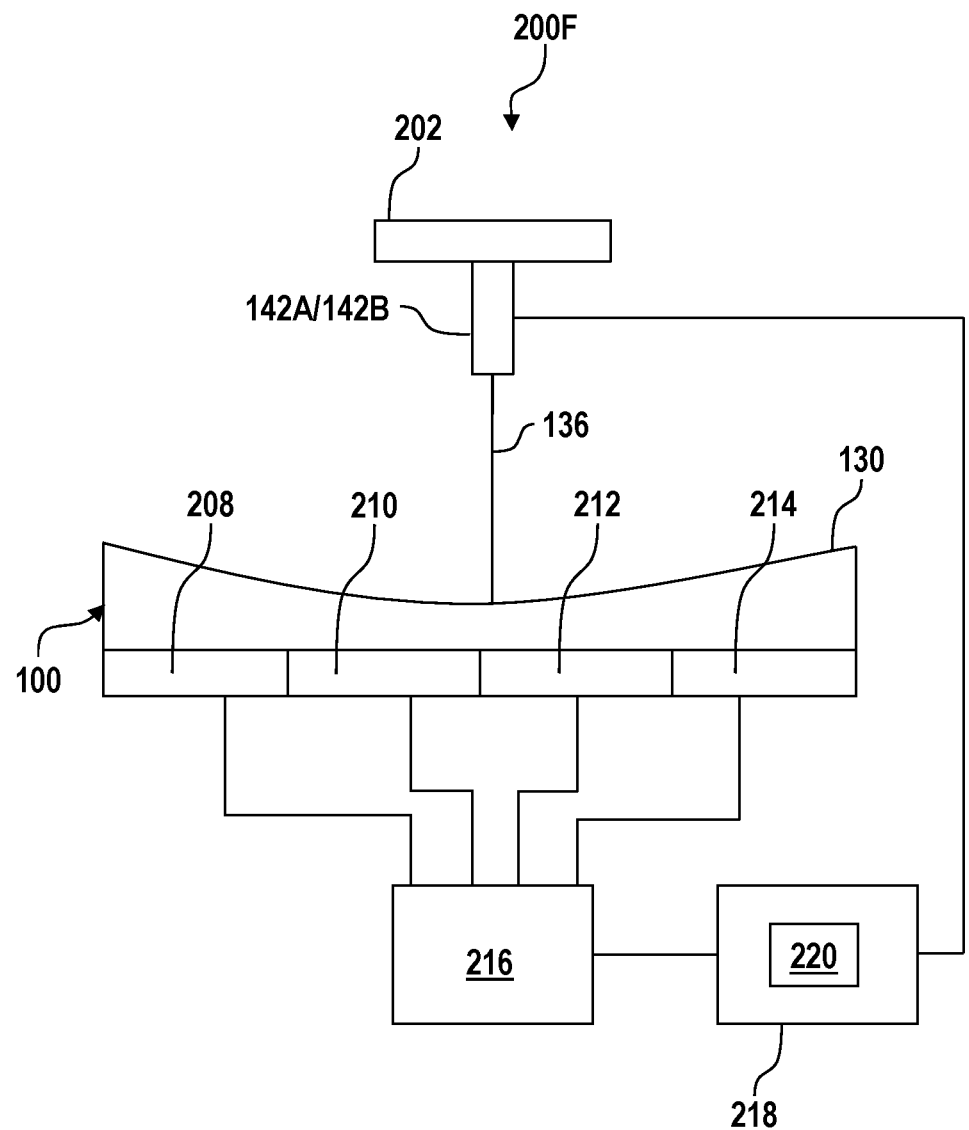
FIG. 38 shows a schematic view of an embodiment of an optical system.

FIG. 38 shows a schematic view of an embodiment of an optical system 200F. The optical system 200F comprises at least one mirror 100, but optionally a plurality of mirrors, a sensor frame 202 and any desired number of measuring arrangements 142A, 142B for measuring the curved used mirror surface 130 of the mirror 100.

Actuators 208, 210, 212, 214 are attached to the back side of the mirror 100, i.e. to the side facing away from the used mirror surface 130. The actuators 208, 210, 212, 214 can also be referred to as actuator systems or actuating elements. The actuators 208, 210, 212, 214 may be adhesively bonded to the mirror 100. The actuators 208, 210, 212, 214 may comprise piezo elements. The actuators 208, 210, 212, 214 might be piezo actuators. Each of the other above-described optical systems 200A, 200B, 200C, 200D, 200E may also comprise such actuators 208, 210, 212, 214.

The actuators 208, 210, 212, 214 are configured to apply forces and/or bending moments to the mirror 100 in order to locally elastically deform the latter. As a result, vibration-related deformations of the used mirror surface 130 can be counteracted with the aid of the actuators 208, 210, 212, 214, and the vibrations or oscillations of the mirror 100 or used mirror surface 130 determined with the aid of the measuring arrangement 142A, 142B can be damped. This also applies to the mirrors M1, M2, M3, M4, M5, M6, M7, M8, M9, M10, M11 of the other optical systems 200A, 200B, 200C, 200D, 200E.

The optical system 200F comprises—like the optical systems 200A, 200B, 200C, 200D, 200E as well—a control device 216 for controlling the actuators 208, 210, 212, 214. For example, this can be implemented by virtue of the control device 216 applying a voltage to or energizing the actuators 208, 210, 212, 214.

Further, an evaluation device 218 for evaluating the measurement signals from the measuring arrangements 142A, 142B is provided. The optical systems 200A, 200B, 200C, 200D, 200E may also comprise such an evaluation device 218. The evaluation device 218 carries out the aforementioned calculations in order to obtain the amplitude $A_k$ and the phase $\Phi_k$. To this end, the evaluation device 218 comprises a computer unit 220. The evaluation device 218 communicates with the control device 216 in order to control the actuators 208, 210, 212, 214 in such a way that the vibrations of the mirror 100 are damped.

Should closed-loop pose control of the mirror 100 be provided, the latter can be adjusted on the basis of the six detected degrees of freedom with the aid of further actuators (not shown). That is to say, the entire mirror 100 can be brought from its actual pose to a target pose. The target pose may vary over time.

Figure 39:
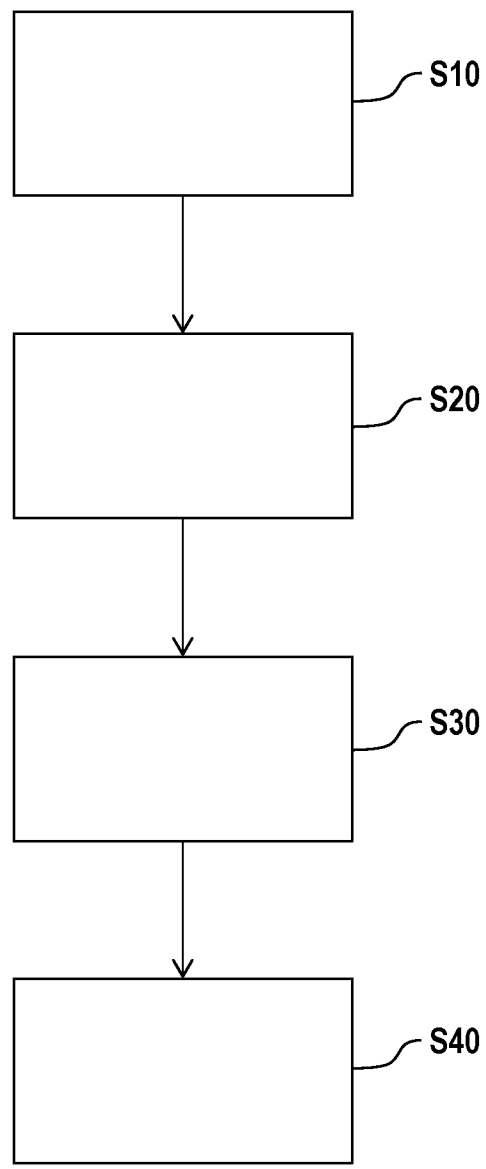
FIG. 39 shows a schematic block diagram of an embodiment of a method for determining a pose of a mirror.

FIG. 39 shows a schematic block diagram of a method for determining the pose of the mirror 100 or used mirror surface 130. The method combines the calculation and evaluation processes described above.

In the method, at least one parameter $\Psi_k$, $\omega_k$ is provided from a mechanical model of the mirror 100, M1, M2, M3, M4, M5, M6, M7, M8, M9, M10, M11 in a step S10. The mechanical model can also be referred to as virtual model. For example, the mechanical model is a CAD (computer-aided design) model. For example, the parameters may comprise the eigenfrequencies $\omega_k$ and/or the mode profiles $\Psi_k$ of N eigenmodes, where k=1, . . . , N. The at least one parameter $\Psi_k$, $\omega_k$ may also be based on a separate measurement on the respective mirror 100, M1, M2, M3, M4, M5, M6, M7, M8, M9, M10, M11. This separate measurement does not occur during the normal operation of the optical system 200A, 200B, 200C, 200D, 200E, 200F but, for example, following its manufacture or integration. In other words, the mechanical model may contain free parameters which are determined by a measurement not presented here in any more detail.

The temporal change of the distance Δd(t) of the point A, A' on the curved used mirror surface 130 of the mirror 100, M1, M2, M3, M4, M5, M6, M7, M8, M9, M10, M11 is detected interferometrically in a step S20. In this case, "interferometrically" means with the aid of at least one interferometer 134 or one measuring arrangement 142A, 142B.

The amplitude $A_k$ and the phase $\Phi_k$ of N eigenmodes are ascertained or calculated from the temporal change of the distance Δd(t) and the at least one parameter $\Psi_k$, $\omega_k$ in a step S30 in order to determine the pose of the mirror 100, M1, M2, M3, M4, M5, M6, M7, M8, M9, M10, M11. This is implemented with the aid of the evaluation device 218 or computer unit 220.

In the step S30, the pose of the mirror 100, M1, M2, M3, M4, M5, M6, M7, M8, M9, M10, M11 can be determined by virtue of the amplitude $A_k$ and the phase $\Phi_k$ of the N eigenmodes being calculated from the mechanical model. For example, this can be implemented via a least square fit.

In a step S40, the actuators 208, 210, 212, 214 can be controlled on the basis of the amplitude $A_k$ and the phase $\Phi_k$ of the N eigenmodes, in such a way that the amplitude $A_k$ is reduced. The vibration is damped by reducing the amplitude $A_k$ or making the latter smaller. In the case where the method includes step S40, the method can also be referred to as a method for damping mirror vibrations of a mirror 100, M1, M2, M3, M4, M5, M6, M7, M8, M9, M10, M11 in an optical system 200A, 200B, 200C, 200D, 200E, 200F.

In particular, instructions for controlling the actuators 208, 210, 212, 214 are generated by the control device 216 in step S40, from at least one amplitude $A_k$ and phase $\Phi_k$ determined in step S30. In particular, the nature of these instructions is such that the amplitude $A_k$ is reduced thereby, i.e. the vibration is damped. In this case, the actuators 208, 210, 212, 214 reshape or deform the used mirror surface 130. This deformation counteracts the amplitude $A_k$, with the result that the amplitude $A_k$ is made smaller or reduced.

Although the present disclosure has been described on the basis of exemplary embodiments, it can be modified in diverse ways.

LIST OF REFERENCE SIGNS

1 Projection exposure apparatus
2 Illumination system
3 Light source
4 Illumination optical unit
5 Object field
6 Object plane
7 Reticle
8 Reticle holder
9 Reticle displacement drive
10 Projection optical unit
11 Image field
12 Image plane
13 Wafer
14 Wafer holder
15 Wafer displacement drive
16 Illumination radiation
17 Collector
18 Intermediate focal plane
19 Deflection mirror
20 First facet mirror
21 First facet
22 Second facet mirror
23 Second facet
100 Mirror
100' Mirror
102 Line
104 Line
106 Line
108 Line
110 Line
112 Line
114 Line
116 Measurement position
118 Measurement position
120 Measurement position
122 Measurement position
124 Measurement position
126 Measurement position
128 Measurement position
130 Used mirror surface
132 Used wavefront
134 Interferometer
136 Measurement beam
138A Beam shaping unit
138B Beam shaping unit
140 Intermediate focus
142A Measuring arrangement
142B Measuring arrangement
144 Optical axis
146 Focus
148 Reflector mirror
150 Binary grating
152 Blazed grating
200A Optical system
200B Optical system
200C Optical system
200D Optical system
200E Optical system
200F Optical system
202 Fixed reference/sensor frame
204 Target
206 Measurement beam
208 Actuator
210 Actuator
212 Actuator
214 Actuator
216 Control device
218 Evaluation device
220 Computer unit
A Point
A' Point
$A_k$ Amplitude
B Region
M1 Mirror
M2 Mirror
M3 Mirror
M4 Mirror
M5 Mirror
M6 Mirror
M7 Mirror
M8 Mirror
M9 Mirror
M10 Mirror
M11 Mirror
Ro Rotation
S1 Light ray
S2 Light ray
S10 Step
S20 Step
S30 Step
S40 Step
Tr Translation
x x-direction
y y-direction
z z-direction
α Angle
$\Phi_k$ Phase
Δd Path length difference
Δx Distance
Δz Height profile

What is claimed is:

1. A method, comprising:
   a) interferometrically detecting a temporal change of a distance of a point on a curved used mirror surface of a mirror in an optical system; and
   b) determining a pose of the mirror by ascertaining an amplitude and a phase of eigenmodes from the temporal change of the distance and a parameter from a mechanical model of the mirror.

2. The method of claim 1, further comprising, before b), providing the parameter.

3. The method of claim 1, comprising using the mechanical model to calculate the amplitude and the phase of the eigenmodes.

4. The method of claim 1, wherein b) comprises interferometrically detecting a temporal change of a distance of a multiplicity of points on the curved used mirror surface of the mirror.

5. The method of claim 1, wherein the mirror supports actuators, and the method further comprises controlling the actuators based on the amplitude and the phase of the eigenmodes to reduce the amplitude.

6. The method of claim 1, comprising using an interferometer and a beam shaping unit.

7. The method of claim 1, further comprising using a beam shaping unit to shape a measurement beam of an interferometer so that light rays of the measurement beam are oriented at right angles to the curved used mirror surface at each point in a region in which the measurement beam is incident on the curved used mirror surface.

8. The method of claim 7, wherein the measurement beam is reflected from the curved used mirror surface, and the method further comprises using a reflector mirror to reflect the reflected measurement beam back to the curved used mirror surface.

9. The method of claim 8, wherein the reflector mirror is between the interferometer and the beam shaping unit.

10. The method of claim 7, wherein the optical system further comprises a fixed reference supporting a measuring arrangement which comprises the interferometer and the beam shaping unit, and the curved used mirror surface faces the fixed reference.

11. The method of claim 10, wherein the fixed reference comprises a sensor frame.

12. The method of claim 10, wherein the optical system further comprises a multiplicity of mirrors, and the fixed reference is interior to the mirrors.

13. The method of claim 1, further comprising using a beam shaping unit to shape the measurement beam so that the measurement beam is focused on the point on the curved used mirror surface.

14. The method of claim 13, wherein the measurement beam is reflected from the curved used mirror surface, and the method further comprises using a reflector mirror to reflect the reflected measurement beam back to the curved used mirror surface.

15. The method of claim 14, wherein a measuring arrangement comprises an interferometer and the beam shaping unit, and the reflector mirror is between the interferometer and the beam shaping unit.

16. The method of claim 13, wherein a measuring arrangement comprises an interferometer and the beam shaping unit, the optical system further comprises a fixed reference supporting the measuring arrangement, and the curved used mirror surface faces the fixed reference.

17. The method of claim 16, wherein the fixed reference comprises a sensor frame.

18. The method of claim 16, wherein the optical system further comprises a multiplicity of mirrors, and the fixed reference is interior to the mirrors.

19. The method of claim 1, wherein the parameter comprises at least one member selected from the group consisting of eigenfrequencies of the eigenmodes and mode profiles of the eigenmodes.

20. The method of claim 1, wherein the optical system is selected from the group consisting of a projection optical unit of a lithography projection exposure apparatus, and an illumination system of a lithography projection exposure apparatus.

* * * * *